(12) United States Patent  
Ozeki et al.

(10) Patent No.: US 9,125,307 B2
(45) Date of Patent: Sep. 1, 2015

(54) FLEXIBLE METAL-CLADDED BASE MATERIAL, METHOD FOR PRODUCING FLEXIBLE METAL-CLADDED BASE MATERIAL, PRINTED WIRING BOARD, MULTILAYER FLEXIBLE PRINTED WIRING BOARD, AND FLEX-RIGID PRINTED WIRING BOARD

(71) Applicant: PANASONIC CORPORATION, Osaka (JP)

(72) Inventors: Takayoshi Ozeki, Osaka (JP); Hiroaki Umehara, Osaka (JP); Yoshiaki Esaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/359,843

(22) PCT Filed: Nov. 22, 2012

(86) PCT No.: PCT/JP2012/080287
§ 371 (c)(1),
(2) Date: May 21, 2014

(87) PCT Pub. No.: WO2013/077397
PCT Pub. Date: May 30, 2013

(65) Prior Publication Data
US 2014/0326487 A1 Nov. 6, 2014

(30) Foreign Application Priority Data

Nov. 22, 2011 (JP) .................. 2011-254535
Aug. 2, 2012 (JP) .................. 2012-172091

(51) Int. Cl.
| | | |
|---|---|---|
| H05K 1/00 | (2006.01) |
| H05K 1/02 | (2006.01) |
| B32B 15/088 | (2006.01) |
| C08G 73/14 | (2006.01) |
| C08G 73/12 | (2006.01) |
| C08L 79/08 | (2006.01) |
| H05K 3/02 | (2006.01) |
| H05K 3/46 | (2006.01) |
| C08G 73/10 | (2006.01) |
| H05K 3/38 | (2006.01) |
| H05K 1/03 | (2006.01) |

(52) U.S. Cl.
CPC .............. *H05K 1/028* (2013.01); *B32B 15/088* (2013.01); *C08G 73/105* (2013.01); *C08G 73/1042* (2013.01); *C08G 73/124* (2013.01); *C08G 73/14* (2013.01); *C08L 79/08* (2013.01); *H05K 3/022* (2013.01); *H05K 3/386* (2013.01); *H05K 3/4655* (2013.01); *H05K 3/4691* (2013.01); *B32B 2270/00* (2013.01); *B32B 2457/08* (2013.01); *H05K 1/0393* (2013.01); *H05K 2201/0154* (2013.01); *Y10T 428/264* (2015.01); *Y10T 428/265* (2015.01); *Y10T 428/31511* (2015.04); *Y10T 428/31681* (2015.04)

(58) Field of Classification Search
CPC ............ B41J 2/14; C08G 18/00; C08K 9/00; C08K 9/06; C09D 4/00; C09K 19/32; C09K 19/322; H01G 9/02; H01G 9/038
USPC ............ 174/254; 361/502, 525; 427/2.1, 162; 522/35; 524/87, 431, 432; 525/329.4; 526/193, 204, 217; 528/44, 196, 272
See application file for complete search history.

(56) References Cited

U.S. PATENT DOCUMENTS

| | | | | |
|---|---|---|---|---|
| 6,124,372 | A  * | 9/2000 | Smith et al. ..................... 522/35 |
| 6,273,985 | B1 * | 8/2001 | DeLouise et al. .......... 156/273.3 |
| 6,862,167 | B1 * | 3/2005 | Banno et al. .................. 361/502 |
| 8,349,966 | B2 * | 1/2013 | Jiang et al. ................. 525/329.4 |
| 2002/0058737 | A1 * | 5/2002 | Nishiwaki et al. ............ 524/431 |
| 2002/0122872 | A1 * | 9/2002 | Leukel et al. ................. 427/2.1 |
| 2003/0219533 | A1 * | 11/2003 | Chabrecek et al. ........... 427/162 |

| 2007/0123682 A1* | 5/2007 | Raj et al. ............... 528/44 |
| 2007/0123683 A1* | 5/2007 | Arumugam et al. ......... 528/44 |
| 2007/0155946 A1* | 7/2007 | Berti et al. ............. 528/272 |
| 2008/0176167 A1* | 7/2008 | Kawamori et al. ........ 430/271.1 |
| 2012/0252941 A1* | 10/2012 | Ibusuki et al. ............. 524/87 |
| 2013/0079479 A1* | 3/2013 | Rosenberg et al. .......... 526/193 |

FOREIGN PATENT DOCUMENTS

| JP | 02-080241 A | 3/1990 |
| JP | 2001-105530 A | 4/2001 |
| JP | 2001-177200 A | 6/2001 |
| JP | 2004-031682 A | 1/2004 |
| JP | 2008-110612 A | 5/2008 |
| JP | 2008-280504 A | 11/2008 |
| JP | 2010-031131 A | 2/2010 |
| JP | 2010-129610 A | 6/2010 |
| JP | 2010-150552 A | 7/2010 |
| JP | 2010-275375 A | 12/2010 |
| JP | 2011-046782 A | 3/2011 |
| JP | 2011-049332 A | 3/2011 |
| JP | 2011-148979 A | 8/2011 |
| JP | 2011-155085 A | 8/2011 |
| WO | 2008-072495 A1 | 6/2008 |

OTHER PUBLICATIONS

International Search Report issued in PCT/JP2012/080287, dated Feb. 19, 2013, with English translation.

* cited by examiner

*Primary Examiner* — Xiaoliang Chen
(74) *Attorney, Agent, or Firm* — McDermott Will & Emery LLP

(57) ABSTRACT

The flexible metal-cladded base material pertaining to the present invention includes a metal foil and a first resin layer. The first resin layer is of a first resin composition containing a polyamide-imide resin. The polyamide-imide resin includes a first constituent unit represented by Formula (1) and a second constituent unit represented by Formula (2). The percentage of the second constituent unit is in a range of 5 to 35% by mol.

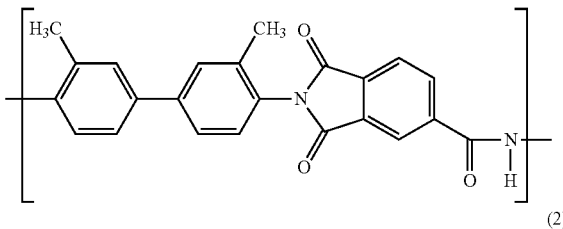

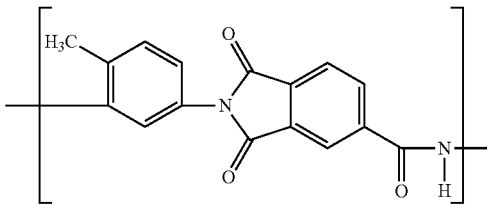

17 Claims, 3 Drawing Sheets

FLEXIBLE METAL-CLADDED BASE MATERIAL, METHOD FOR PRODUCING FLEXIBLE METAL-CLADDED BASE MATERIAL, PRINTED WIRING BOARD, MULTILAYER FLEXIBLE PRINTED WIRING BOARD, AND FLEX-RIGID PRINTED WIRING BOARD

RELATED APPLICATIONS

This application is the U.S. National Phase under 35 U.S.C. §371 of International Application No. PCT/JP2012/080287, filed on Nov. 22, 2012, which in turn claims the benefit of Japanese Application No. 2012-172091, filed on Aug. 2, 2012, and Japanese Application No. 2011-254535, filed on Nov. 22, 2011, the disclosures of which Applications are incorporated by reference herein.

TECHNICAL FIELD

The present invention relates to a flexible metal-cladded base material suitable as a material for producing a printed wiring board, a production method of the flexible metal-cladded base material, a printed wiring board produced by using the flexible metal-cladded base material, a multilayer flexible printed wiring board produced by using the flexible metal-cladded base material, and a flex-rigid printed wiring board produced by using the flexible metal-cladded base material.

BACKGROUND ART

Compact and slim electronic devices include many flexible printed wiring boards. To achieve higher-density and thinner electronic devices, the flexible printed wiring boards having a multilayer structure have been more required. In addition, as the flexible printed wiring boards are required to be higher quality and more inexpensive, it is difficult to fulfill such high requirements for the flexible printed wiring boards.

In order to make a flexible printed wiring board with a multilayer structure, it is necessary to stack, on a core material including an electrically insulating layer (first electrically insulating layer) composed of a polyimide film or the like and a conductive layer (first conductive layer), another electrically insulating layer (second electrically insulating layer) and another conductive layer (second conductive layer). The technique for forming the second electrically insulating layer and the second conductive layer is exemplified by a method of using a resin sheet with a metal foil, in which the resin sheet includes a metal foil and an adhesive resin layer in a B-stage state. The adhesive resin layer is made from, for example, an epoxy resin composition having excellent adhesion properties and electrical insulation properties.

However, when such a resin sheet with a metal foil is used, the electrically insulating layer composed of a cured product of the resin layer has insufficient easy-bending properties. On this account, such a resin sheet has not been able to satisfy recent high requirements for flexible printed wiring boards.

In order to improve the easy-bending properties of the cured product of a resin layer of a resin sheet with a metal foil, there has been proposed a method of forming an anchor coat layer containing a polyimide on a metal foil and forming an adhesive resin layer on the anchor coat layer. The anchor coat layer containing a polyimide is formed by applying a varnish containing a polyamic acid that is a precursor of the polyimide onto a metal foil layer and heating the varnish to form a film.

In order to form the anchor coat layer containing the polyimide, it is necessary to cause imidization of the polyamic acid by promoting cyclization of the polyamic acid by heating the varnish, and this requires heating of the varnish at a high temperature of 300° C. or higher. When heated to such a high temperature, the anchor coat layer would greatly contract as a result of cooling, and such contraction may cause a warp of the resin sheet with a metal foil. A largely warped resin sheet with a metal foil may impair processing stability when the resin sheet with a metal foil is used or may impair the dimensional stability of a product produced by using the resin sheet with a metal foil.

To address this problem, the present applicant has developed a varnish for forming an anchor coat layer, and the varnish contains a polyimide having an imide ring-closing ratio of 80% or more (see Patent Literature 1). In this case, by simply volatilizing a solvent from the varnish, an anchor coat layer containing the polyimide can be formed, and this can lower the heating temperature.

CITATION LIST

Patent Literature

Patent Literature 1: Japanese Patent Application Publication No. 2011-49332

SUMMARY OF INVENTION

Technical Problem

The anchor coat layer containing the polyimide unfortunately has low adhesive properties without treatment. In a case where an adhesive resin layer formed from an epoxy resin composition or the like is placed on the anchor coat layer, it is necessary to subject the anchor coat layer to a surface treatment such as corona discharge treatment in advance in order to improve the adhesion between the anchor coat layer and the adhesive resin layer, and thus the production efficiency of a flexible printed wiring board is likely to be reduced.

In such a circumstance, there is a demand for a resin sheet with a metal foil that does not cause such a problem and has sufficient easy-bending properties, heat resistance, and other characteristics to be applied to a flexible printed wiring board.

In view of the above circumstances, an object of the present invention is to provide a flexible metal-cladded base material that can improve the productivity and the dimensional accuracy of a printed wiring board and can achieve good easy-bending properties and heat resistance of a printed wiring board, a production method of the flexible metal-cladded base material, a printed wiring board produced by using the flexible metal-cladded base material, a multilayer flexible printed wiring board produced by using the flexible metal-cladded base material, and a flex-rigid printed wiring board produced by using the flexible metal-cladded base material.

Solution to Problem

The flexible metal-cladded base material of the first aspect in accordance with the present invention includes a metal foil and a first resin layer on the metal foil. The first resin layer is of a first resin composition containing a polyamide-imide resin, the polyamide-imide resin includes a first constituent unit represented by Structural Formula (1) and a second constituent unit represented by Structural Formula (2), and a percentage of the second constituent unit to a total of the first constituent unit and the second constituent unit in the polyamide-imide resin is in a range of 5 to 35% by mol.

[Chemical Formula 1]

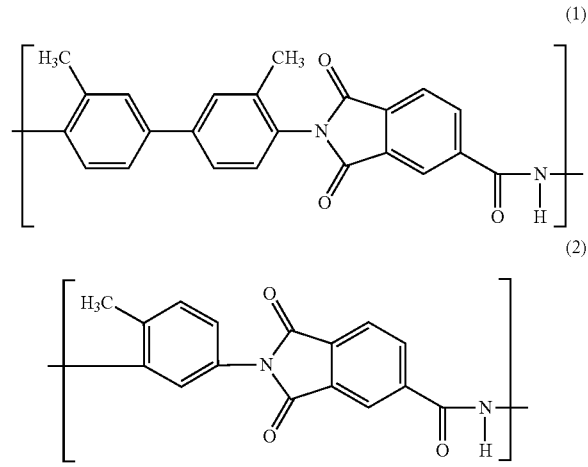

According to the flexible metal-cladded base material of the second aspect in accordance with the present invention, based on the first aspect, the polyamide-imide resin further includes a third constituent unit represented by Structural Formula (3). The first resin layer may have a thickness ranging from 1 to 15 μm.

[Chemical Formula 2]

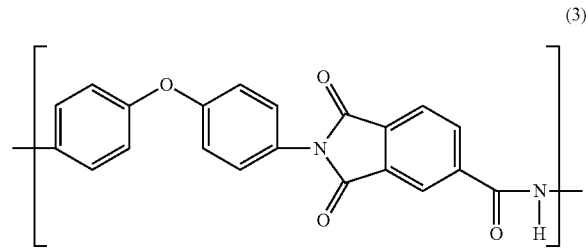

According to the flexible metal-cladded base material of the third aspect in accordance with the present invention, based on the second aspect, the polyamide-imide resin includes a first resin consisting of a molecule including the third constituent unit and a second resin consisting of a molecule including the first constituent unit and the second constituent unit.

According to the flexible metal-cladded base material of the fourth aspect in accordance with the present invention, based on the third aspect, a percentage of the second resin to the polyamide-imide resin is in a range of 30 to 70% by mass.

According to the flexible metal-cladded base material of the fifth aspect in accordance with the present invention, based on any one of the first to fourth aspects in accordance with the present invention, it is preferable that the first resin composition further contain a bismaleimide.

According to the flexible metal-cladded base material of the sixth aspect in accordance with the present invention, based on the fifth aspect in accordance with the present invention, it is preferable that the bismaleimide is at least one compound selected from 4,4'-diphenylmethane bismaleimide, bisphenol A diphenyl ether bismaleimide, 3,3'-dimethyl-5,5'-diethyl-4,4'-diphenylmethane bismaleimide, and 1,6'-bismaleimide-(2,2,4-trimethyl)hexane.

According to the flexible metal-cladded base material of the seventh aspect in accordance with the present invention, based on the fifth or sixth aspect in accordance with the present invention, it is preferable that a percentage of the bismaleimide to a total of the polyamide-imide resin and the bismaleimide in the first resin composition be in a range of 3 to 30% by mass.

According to the flexible metal-cladded base material of the eighth aspect in accordance with the present invention, based on any one of the first to seventh aspects in accordance with the present invention, it is preferable that the first resin layer have a thickness ranging from 2 to 15 μm. It is also preferable that the first resin layer have a thickness ranging from 1 to 15 μm.

According to the flexible metal-cladded base material of the ninth aspect in accordance with the present invention, based on any one of the first to eighth aspects in accordance with the present invention further includes a second resin layer in a B-stage state on the first resin layer, and it is preferable that the second resin layer be of a second resin composition containing an epoxy resin.

According to the flexible metal-cladded base material of the tenth aspect in accordance with the present invention, based on the ninth aspect in accordance with the present invention, it is preferable that the second resin composition contain the epoxy resin, a hardening agent, and a carbodiimide-modified soluble polyamide.

According to the flexible metal-cladded base material of the eleventh aspect in accordance with the present invention, based on the ninth or tenth aspect in accordance with the present invention, it is preferable that the second resin layer have a thickness ranging from 10 to 40 μm.

The production method of a flexible metal-cladded base material of the twelfth aspect in accordance with the present invention is a production method of a flexible metal-cladded base material, and the method includes applying a first resin composition onto a metal foil and heating the first resin composition at a temperature to form a first resin layer. The first resin composition contains a polyamide-imide resin, the polyamide-imide resin includes a first constituent unit represented by Structural Formula (1) and a second constituent unit represented by Structural Formula (2), a percentage of the second constituent unit to a total of the first constituent unit and the second constituent unit in the polyamide-imide resin is in a range of 5 to 35% by mol, and a maximum of the temperature is in a range of 230 to 290° C.

[Chemical Formula 3]

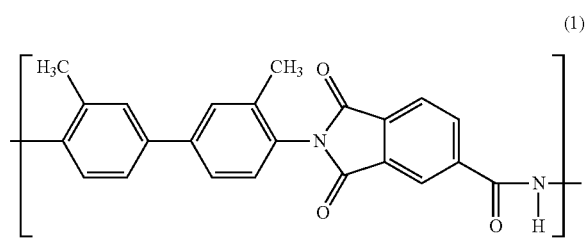

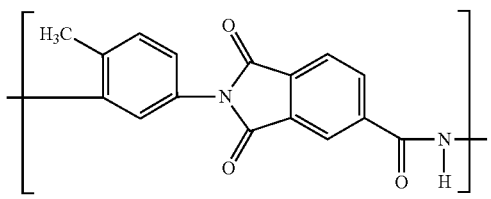
(2)

According to the production method of a flexible metal-cladded base material of the thirteenth aspect in accordance with the present invention, based on the twelfth aspect in accordance with the present invention, it is preferable that the first resin composition further contain a bismaleimide.

According to the production method of a flexible metal-cladded base material of the fourteenth aspect in accordance with the present invention, based on the thirteenth aspect, preferably the production method of a flexible metal-cladded base material further includes applying a second resin composition containing an epoxy resin onto the first resin layer and heating the second resin composition to form a second resin layer in a B-stage state.

The printed wiring board of the fifteenth aspect in accordance with the present invention includes an electrically insulating layer made of the first resin layer and the second resin layer of the flexible metal-cladded base material pertaining to any one of the ninth to eleventh aspects or produced by the production method pertaining to the fourteenth aspect and a conductive wiring made of the metal foil of the flexible metal-cladded base material.

The multilayer flexible printed wiring board of the sixteenth aspect in accordance with the present invention includes two or more electrically insulating layers sequentially stacked and one or more conductive wirings formed between adjacent electrically insulating layers of the two or more electrically insulating layers. The multilayer flexible printed wiring board at least includes an electrically insulating layer made of the first resin layer and the second resin layer of the flexible metal-cladded base material pertaining to any one of the ninth to eleventh aspects or produced by the production method pertaining to the fourteenth aspect as the electrically insulating layer and at least includes a conductive wiring made of the metal foil of the flexible metal-cladded base material as the conductive wiring.

The flex-rigid printed wiring board in accordance with the present invention includes two or more electrically insulating layers sequentially stacked and one or more conductive wirings formed between adjacent electrically insulating layers of the two or more electrically insulating layers and includes two or more rigid parts and one or more flexible part interconnecting adjacent rigid parts of the two or more rigid parts. The flex-rigid printed wiring board at least includes an electrically insulating layer made of the first resin layer and the second resin layer of the flexible metal-cladded base material of any one of the ninth to eleventh aspects or produced by the production method of the fourteenth aspect as the electrically insulating layer and at least includes a conductive wiring made of the metal foil of the flexible metal-cladded base material as the conductive wiring.

Advantageous Effects of Invention

The present invention can provide a flexible metal-cladded base material that can improve the productivity and the dimensional accuracy of a printed wiring board and can achieve good easy-bending properties and heat resistance of a printed wiring board.

The present invention can also provide a printed wiring board, a multilayer flexible printed wiring board, and a flex-rigid printed wiring board that have high productivity and high dimensional accuracy and achieve good easy-bending properties and heat resistance.

DESCRIPTION OF EMBODIMENTS

A flexible metal-cladded base material pertaining to the present embodiment includes a metal foil and a first resin layer and may further include a second resin layer.

Figure 1:
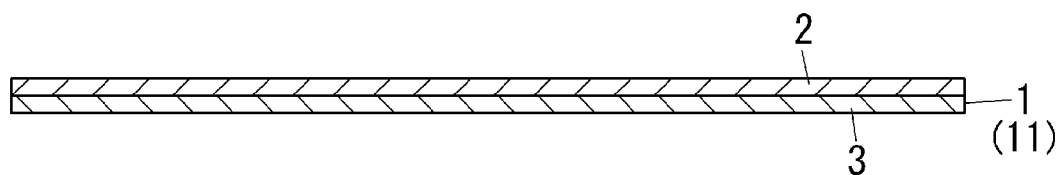
FIG. 1 is a cross-sectional view showing a flexible metal-cladded base material of the first mode in the embodiment of the present invention.

FIG. 1 shows the first mode of the flexible metal-cladded base material 1 of the present embodiment. The flexible metal-cladded base material 1 of the present mode is a single-sided metal-cladded plate having flexibility (single-sided flexible metal-cladded base material 11). The flexible metal-cladded base material 1 includes a metal foil 2 and a first resin layer 3 on one face in the thickness direction of the metal foil 2.

The metal foil 2 may be made of any materials. An example of the metal foil 2 is a copper foil. The thickness of the metal foil 2 is appropriately set and is preferably in a range of 3 to 70 µm.

The metal foil 2 may have the thickness of 1 to 5 µm or 1 to 3 µm. When including such a thin metal foil 2, the flexible metal-cladded base material 1 can be used to form a thin printed wiring board. When including the slim metal foil 2, the flexible metal-cladded base material 1 preferably includes a carrier material on the opposite face of the metal foil 2 from the face on which the first resin layer 3 is present. This structure can prevent the metal foil 2 from having defects such as wrinkles which would otherwise occur in the formation of the first resin layer 3 on the metal foil 2. The carrier material may be another metal foil thicker than the metal foil 2, for example.

The first resin layer 3 is of a first resin composition containing a polyamide-imide resin. The polyamide-imide resin in the first resin composition includes a first constituent unit represented by Structural Formula (1) and a second constituent unit represented by Structural Formula (2) as the constituent units (repeating units).

The percentage of the second constituent unit to the total of the first constituent unit and the second constituent unit is 5 to 35% by mol. When the percentage of the second constituent unit is 35% by mol or less (in other words, when the percentage of the first constituent unit is 65% by mol or more), the first resin layer 3 can form an insulating layer having a higher heat resistance. When the percentage of the second constituent unit is 5% by mol or more (in other words, when the percentage of the first constituent unit is 95% by mol or less), the polyamide-imide resin has a higher solubility in a solvent, and this can suppress forming defects during the formation of the first resin layer 3. The percentage is more preferably in a range of 10 to 30% by mol.

[Chemical Formula 4]

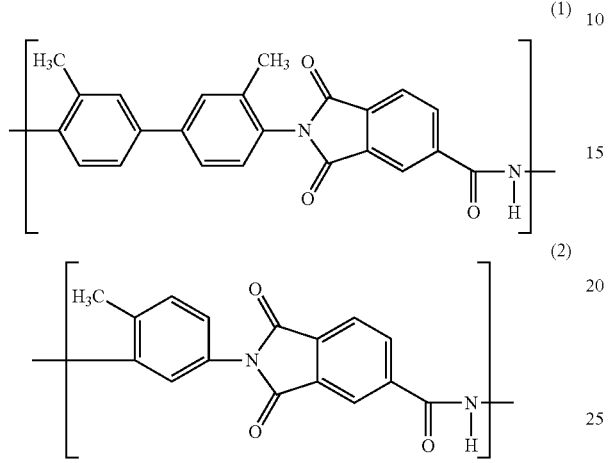

The polyamide-imide resin preferably includes, as the constituent units, the first constituent unit and the second constituent unit only. However, the polyamide-imide resin may further include an additional constituent unit (fourth constituent unit) different from the first constituent unit and the second constituent unit. The percentage of the fourth constituent unit to the total of the constituent units in the polyamide-imide resin is preferably 20% by mol or less and more preferably 10% by mol or less.

The fourth constituent unit has the structure represented by Structural Formula (4), for example.

[Chemical Formula 5]

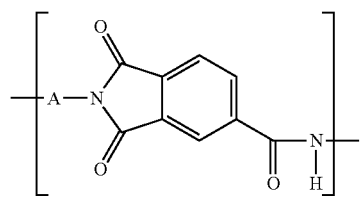

In Structural Formula (4), A is an aromatic residue. The structure of A is not particularly limited and is exemplified by the structures shown in [Chemical Formula 6].

[Chemical Formula 6]

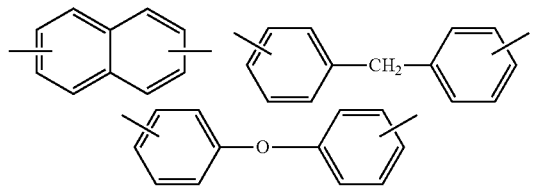

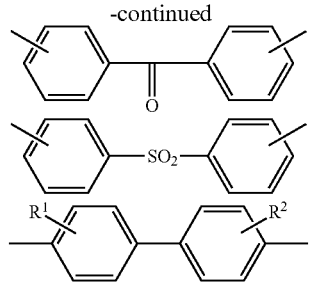

$R^1$ and $R^2$ in [Chemical Formula 6] are selected from hydrogen, alkyl groups having 1 to 3 carbon atoms, and an allyl group. However, the fourth constituent unit does not have the same structure as that of the first constituent unit or the second constituent unit.

The polyamide-imide resin in the first resin composition may have a third constituent unit represented by Structural Formula (3).

[Chemical Formula 7]

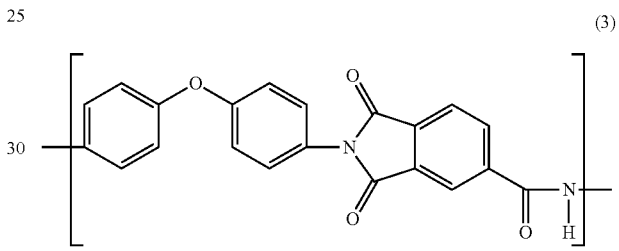

The polyamide-imide resin includes a first resin consisting of a molecule including the third constituent unit, for example.

The first resin preferably includes the third constituent unit only. The first resin may include the third constituent unit and an additional constituent unit (fifth constituent unit) different from the third constituent unit. The percentage of the fifth constituent unit to the total of the constituent units in the first resin is preferably 20% by mol or less and more preferably 10% by mol or less. In other words, the percentage of the third constituent unit to the total of the constituent units in the first resin is preferably 80% by mol or more and more preferably 90% by mol or more.

The fifth constituent unit has the structure represented by Structural Formula (5), for example.

[Chemical Formula 8]

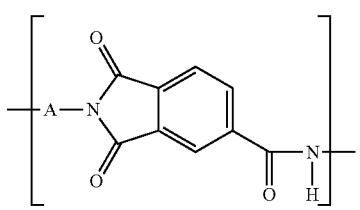

In Structural Formula (5), A is an aromatic residue. The structure of A is not particularly limited and is exemplified by the structures shown in [Chemical Formula 9].

[Chemical Formula 9]

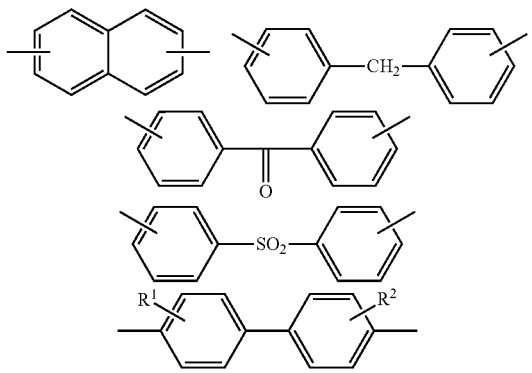

$R^1$ and $R^2$ in [Chemical Formula 9] are selected from hydrogen, alkyl groups having 1 to 3 carbon atoms, and an allyl group.

In the present embodiment, when the first resin composition containing a polyamide-imide resin having the third constituent unit is used to form a first resin layer having a thickness of 1 to 15 μm, the first resin layer obtains much higher easy-bending properties and higher heat resistance. In particular, the third constituent unit largely contributes to the improvement of the easy-bending properties of the first resin layer. On this account, an electrically insulating layer formed of the first resin layer obtains much higher easy-bending properties and higher heat resistance. The first resin layer and the electrically insulating layer exert high heat resistance without containing a halogen flame retardant. This can suppress the generation of poisonous gases and smoking if the first resin layer or the electrically insulating layer burn.

Furthermore, in the present embodiment, the first resin layer has higher affinity with a thermosetting resin such as an epoxy resin. On this account, to produce a multilayer printed wiring board by fixing the flexible metal-cladded base material on an appropriate core material, it is unnecessary to subject the first resin layer to previous surface treatment for improving adhesion when the flexible metal-cladded base material is bonded to the core material through a thermosetting resin composition such as an epoxy resin composition. Hence the productivity of the printed wiring board can be improved.

The first resin layer preferably is thin from the viewpoint of a reduction in size and thickness of the printed wiring board. On this account, the first resin layer more preferably has a thickness ranging from 2 to 10 μm and even more preferably from 2 to 8 μm.

When the polyamide-imide resin further includes the first constituent unit represented by Structural Formula (1) and the second constituent unit represented by Structural Formula (2) in addition to the third constituent unit, the first resin layer and an electrically insulating layer formed of the first resin layer are likely to have slightly lower easy-bending properties but achieve high easy-bending properties. In addition, the first constituent unit and the second constituent unit allow the first resin layer to have a higher glass transition temperature, and this further improves the heat resistance of the first resin layer and an electrically insulating layer formed of the first resin layer. On this account, the first resin layer and the electrically insulating layer obtain excellent easy-bending properties and heat resistance.

An example of the polyamide-imide resin including the first constituent unit, the second constituent unit, and the third constituent unit includes the first resin and further a second resin consisting of a molecule including the first constituent unit and the second constituent unit.

The second resin preferably includes the first constituent unit and the second constituent unit only. The second resin may include, in addition to the first constituent unit and the second constituent unit, an additional constituent unit (sixth constituent unit) different from the first constituent unit and the second constituent unit. The sixth constituent unit has the structure represented by Structural Formula (5) as with the fifth constituent unit, for example. The percentage of the sixth constituent unit to the total of the constituent units in the second resin is preferably 20% by mol or less and more preferably 10% by mol or less. In other words, the percentage of the total of the first constituent unit and the second constituent unit to the total of the constituent units in the second resin is preferably 80% by mol or more and more preferably 90% by mol or more.

The percentage of the second constituent unit to the total of the first constituent unit and the second constituent unit in the second resin is preferably 5 to 35% by mol. When the percentage of the second constituent unit is 35% by mol or less (in other words, when the percentage of the first constituent unit is 65% by mol or more), the first resin layer forms an electrically insulating layer having much higher heat resistance. When the percentage of the second constituent unit is 5% by mol or more (in other words, when the percentage of the first constituent unit is 95% by mol or less), the second resin has higher solubility in a solvent, and this can suppress forming defects during the formation of the first resin layer. The percentage of the second constituent unit is more preferably in a range of 10 to 30% by mol.

For the polyamide-imide resin including the first resin and the second resin, the percentage of the second resin to the total of the polyamide-imide resin is preferably 30 to 70% by mass. The percentage of the first resin to the total of the polyamide-imide resin is preferably 30 to 70% by mass. Thus, the easy-bending properties and the heat resistance of each of the first resin layer and the electrically insulating layer are improved particularly in good balance.

The mode of the polyamide-imide resin including the first constituent unit, the second constituent unit, and the third constituent unit is not limited to the above. For example, the polyamide-imide resin may include a resin consisting of a molecule including the first constituent unit, the second constituent unit, and the third constituent unit. Alternatively, the polyamide-imide resin may include a resin consisting of a molecule including the first constituent unit, a resin consisting of a molecule including the second constituent unit, and a resin consisting of a molecule including the third constituent unit.

For the polyamide-imide resin including the first constituent unit, the second constituent unit, and the third constituent unit, the percentage of the total of the first constituent unit and the second constituent unit to the total of the constituent units included in the polyamide-imide resin is preferably 30 to 70% by mass. The percentage of the third constituent unit to the total of the constituent units included in the polyamide-imide resin is preferably 30 to 70% by mass. Thus, the easy-bending properties and the heat resistance of each of the first resin layer and the electrically insulating layer are improved particularly in good balance.

For the polyamide-imide resin including the first constituent unit, the second constituent unit, and the third constituent unit, the percentage of the second constituent unit to the total of the first constituent unit and the second constituent unit in the polyamide-imide resin is preferably 5 to 35% by mol.

When the percentage of the second constituent unit is 35% by mol or less (in other words, when the percentage of the first constituent unit is 65% by mol or more), the first resin layer forms an electrically insulating layer having much higher heat resistance. When the percentage of the second constituent unit is 5% by mol or more (in other words, when the percentage of the first constituent unit is 95% by mol or less), the polyamide-imide resin has higher solubility in a solvent, and this can suppress forming defects during the formation of the first resin layer. The percentage is more preferably in a range of 10 to 30% by mol.

For the polyamide-imide resin including the first constituent unit, the second constituent unit, and the third constituent unit, the percentage of the total of the first constituent unit, the second constituent unit, and the third constituent unit to the total of the constituent units included in the polyamide-imide resin is preferably 80% by mass or more and more preferably 90% by mass or more. The polyamide-imide resin is more preferably composed of the first constituent unit, the second constituent unit, and the third constituent unit only.

The polyamide-imide resin may be synthesized by an appropriate technique such as an isocyanate method and an amine method (such as an acid chloride method, a low-temperature solution polymerization, and a room-temperature solution polymerization), and the isocyanate method is specifically preferably employed.

In the isocyanate method, for example, trimellitic acid or a derivative thereof (such as an anhydride and a halide) and an aromatic diisocyanate for introducing an aromatic residue are added to an organic solvent, and as necessary, a catalyst is added. Under the condition, the mixture is reacted preferably at a temperature of 10 to 200° C. for 1 to 24 hours, and thus a polyamide-imide resin is synthesized.

As the aromatic diisocyanate for introducing an aromatic residue, 4,4'-diisocyanato-3,3'-dimethylbiphenyl and 2,4-diisocyanatotoluene are used. In this case, by adjusting the molar ratios of 4,4'-diisocyanato-3,3'-dimethylbiphenyl and 2,4-diisocyanatotoluene, the ratios of the constituent unit (1) and the constituent unit (2) in the polyamide-imide resin can be controlled. As necessary, by appropriately using an additional aromatic diisocyanate, the fourth constituent unit is introduced into the polyamide-imide resin.

For the polyamide-imide resin including the first constituent unit, the second constituent unit, and the third constituent unit, by adjusting the molar ratios of 4,4'-oxybis(isocyanatobenzene), 4,4'-diisocyanato-3,3'-dimethylbiphenyl, and 2,4-diisocyanatotoluene, the ratios of the first constituent unit, the second constituent unit, and the third constituent unit can be controlled in the polyamide-imide resin. To prepare the first resin, 4,4'-oxybis(isocyanatobenzene) is used as the aromatic diisocyanate. To prepare the second resin, 4,4'-diisocyanato-3,3'-dimethylbiphenyl and 2,4-diisocyanatotoluene are used as the aromatic diisocyanate. As necessary, by appropriately using an additional aromatic diisocyanate, the fifth constituent unit, the sixth constituent unit, and other constituent units are introduced into the polyamide-imide resin.

The polyamide-imide resin is specifically exemplified by HR-16NN (product number) available from Toyobo Co., Ltd.

Examples of the organic solvent include N-methyl-2-pyrrolidone, N,N-dimethylformamide, N,N-dimethylacetamide, 1,3-dimethyl-2-imidazolidinone, tetramethylurea, sulfolane, dimethylsulfoxide, γ-butyrolactone, cyclohexanone, and cyclopentanone. Together with these solvents, hydrocarbon organic solvents such as toluene and xylene; ether organic solvents such as diglyme, triglyme, and tetrahydrofuran; and ketone organic solvents such as methyl ethyl ketone and methyl isobutyl ketone may be used in combination.

Examples of the catalyst include tertiary amines, alkali metal compounds, and alkaline earth metal compounds.

In the amine method, for example, trimellitic acid or a derivative thereof (such as an anhydride and a halide) and an aromatic diamine for introducing an aromatic residue are added to an organic solvent, and as necessary, a catalyst is added. Under the condition, the mixture is reacted preferably at a temperature of 0 to 200° C. for 1 to 24 hours, and thus a polyamide-imide resin is synthesized.

The polyamide-imide resin may have any molecular weight but preferably has a number average molecular weight ranging from 10,000 to 40,000 in order to further improve the solubility of the polyamide-imide resin in a solvent. The number average molecular weight is determined by gel permeation chromatography.

The first resin composition preferably, further contains a bismaleimide. In this case, an electrically insulating layer composed of the first resin layer obtains further higher heat resistance. The bismaleimide is not particularly limited but is preferably at least one compound selected from 4,4'-diphenylmethane bismaleimide, bisphenol A diphenyl ether bismaleimide, 3,3'-dimethyl-5,5'-diethyl-4,4'-diphenylmethane bismaleimide, and 1,6'-bismaleimide-(2,2,4-trimethyl)hexane.

The percentage of the bismaleimide to the total of the polyamide-imide resin and the bismaleimide in the first resin composition is preferably in a range of 3 to 30% by mass. When the percentage is 3% by mass or more, an electrically insulating layer composed of the first resin layer obtains sufficiently improved heat resistance. When the percentage is 30% by mass or less, an electrically insulating layer composed of the first resin layer maintains good flexibility. The percentage is more preferably in a range of 3 to 20% by mass.

The first resin composition also preferably contains an epoxy compound in place of or in combination with the bismaleimide. Also in this case, an electrically insulating layer composed of the first resin layer 3 obtains much higher heat resistance. The epoxy compound is not particularly limited but is preferably a polyfunctional epoxy resin having a naphthalene skeleton. Examples of the polyfunctional epoxy resin having a naphthalene skeleton include novolac epoxy resins, trifunctional epoxy resins, aralkyl epoxy resins, and cresol co-condensation epoxy resins. Additional examples of the polyfunctional epoxy compound include bisphenol A epoxy resins, polyphenol epoxy resins, polyglycidylamine epoxy resins, alcohol epoxy resins, alicyclic epoxy resins, and novolac epoxy resins having a phenol skeleton and a biphenyl skeleton.

The percentage of the epoxy compound to the total of the polyamide-imide resin and the epoxy compound in the first resin composition is preferably in a range of 3 to 30% by mass. When the percentage is 3% by mass or more, an electrically insulating layer composed of the first resin layer 3 obtains sufficiently improved heat resistance. When the percentage is 30% by mass or less, an electrically insulating layer composed of the first resin layer 3 maintains good flexibility. The percentage is more preferably in a range of 3 to 20% by mass.

The first resin composition is prepared by adding the polyamide-imide resin in an appropriate solvent and preferably by further adding the bismaleimide.

Examples of the solvent include N-methyl-2-pyrrolidone, N,N-dimethylformamide, N,N-dimethylacetamide, 1,3-dimethyl-2-imidazolidinone, tetramethylurea, sulfolane, dimethylsulfoxide, γ-butyrolactone, cyclohexanone, and cyclopentanone. Together with these solvents, hydrocarbon organic solvents such as toluene and xylene; ether organic solvents such as diglyme, triglyme, and tetrahydrofuran; and ketone organic solvents such as methyl ethyl ketone and methyl isobutyl ketone may be used in combination. The first resin composition may contain the solvent used for the synthesis of the polyamide-imide resin without treatment.

The ratio of the solvent in the first resin composition is appropriately set in consideration of the coating properties, the film formability, or other characteristics of the first resin composition, and the amount of the solvent is preferably adjusted so that the first resin composition particularly has a viscosity ranging from 200 to 800 cP.

The first resin composition may further contain appropriate additives in addition to the components above.

The first resin composition is applied onto a metal foil 2 to form a film, thus forming a first resin layer 3. To apply the first resin composition onto the metal foil 2, an appropriate method such as comma coating, die coating, roll coating, and gravure coating can be employed.

By heating the first resin composition applied onto the metal foil 2, a solvent is volatilized from the first resin composition, and thus the first resin layer 3 is formed. In this case, the heating temperature may be an appropriate temperature allowing volatilization of the solvent. In particular, the maximum temperature of the heating temperature during the heating is preferably in a range of 230 to 290° C. In this case, contraction of the first resin layer 3 caused by cooling is suppressed and thus it is possible to effectively prevent the warp of the flexible metal-cladded base material 1.

The first resin layer 3 formed in this manner has high easy-bending properties and high heat resistance, and this improves the easy-bending properties and the heat resistance of an electrically insulating layer formed of the first resin layer. The electrically insulating layer exerts high heat resistance without containing a halogen flame retardant, and this can suppress the generation of poisonous gases and smoking if the electrically insulating layer burns. In addition, the first resin layer 3 has high affinity with a thermosetting resin such as an epoxy resin. On this account, to produce a multilayer printed wiring board by forming the flexible metal-cladded base material 1 on an appropriate core material, it is unnecessary to subject the first resin layer 3 to previous surface treatment for improving adhesion when the flexible metal-cladded base material 1 is bonded to the core material through a thermosetting resin composition such as an epoxy resin composition. Hence, the productivity of the printed wiring board is improved.

The thickness of the first resin layer 3 is not particularly limited but is preferably in a range of 2 to 15 µm. In this case, an electrically insulating layer formed of the first resin layer 3 obtains sufficiently high easy-bending properties. The first resin layer 3 also preferably has a thickness ranging from 1 to 15 µm. Also in this case, an electrically insulating layer formed of the first resin layer 3 obtains sufficiently high easy-bending properties. The first resin layer 3 preferably is thin from the viewpoint of a reduction in size and thickness of the printed wiring board. On this account, the first resin layer 3 more preferably has a thickness ranging from 2 to 10 µm and even more preferably from 2 to 8 µm.

For the first resin layer formed of the polyimide resin in a conventional manner, a surface treatment such as corona discharge treatment is necessary to improve the adhesion to a thermosetting resin. In order to reduce damage due to the surface treatment, it is necessary to increase the thickness of the first resin layer to some extent. On this account, it has been difficult to reduce the thickness of the first resin layer of the polyimide resin. However, the first resin layer 3 according to the present embodiment has high adhesion to a thermosetting resin such as an epoxy resin as described above and thus the surface treatment for improving the adhesion is unnecessary. In the present embodiment, there is no need to consider the damage caused by the surface treatment, and thus the first resin layer 3 can be thinned.

The single-sided flexible metal-cladded base material 11 having high flexibility and formed in this manner is used in order to prepare a printed wiring board and is particularly preferably used to produce a flexible printed wiring board. In other words, the metal foil 2 of the single-sided flexible metal-cladded base material 11 is utilized in order to form conductive wirings of a printed wiring board, and the first resin layer 3 of the single-sided flexible metal-cladded base material 11 is utilized in order to form an electrically insulating layer of a printed wiring board. For example, by fixing the single-sided flexible metal-cladded base material 11 on a core material through a thermosetting resin composition such as an epoxy resin composition as described above, a multilayer printed wiring board can be produced.

Figure 2:
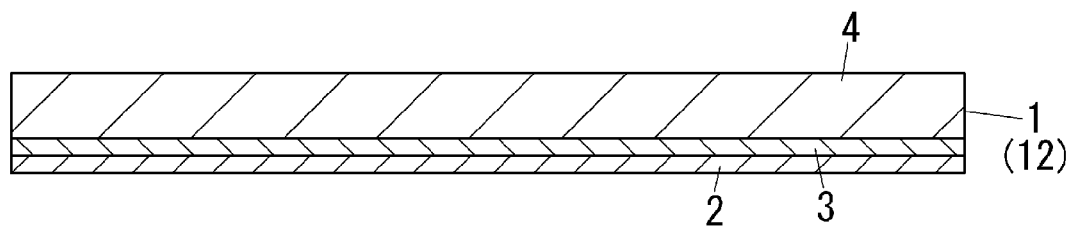
FIG. 2 is a cross-sectional view showing a flexible metal-cladded base material of the second mode in the embodiment of the present invention.

FIG. 2 shows the second mode of the flexible metal-cladded base material 1. The flexible metal-cladded base material 1 of the present mode is a resin sheet with a metal foil having flexibility (metal foil 12 with a flexible resin for multilayering). The flexible metal-cladded base material 1 includes a metal foil 2, a first resin layer 3, and a second resin layer 4 in a B-stage state. By forming the second resin layer 4 in a B-stage state on the first resin layer 3 of the flexible metal-cladded base material 1 (single-sided flexible metal-cladded base material 11) of the first mode, the flexible metal-cladded base material 1 of the second mode is obtained.

The structures of the metal foil 2 and the first resin layer 3 of the present mode are the same as the metal foil 2 and the first resin layer 3 of the first mode, and thus the explanation thereof is left out.

Also in the present mode, the metal foil 2 may have a thickness of 1 to 5 µm or 1 to 3 µm. When including such a thin metal foil 2, the flexible metal-cladded base material 1 can be used to form a slim printed wiring board. When including the thin metal foil 2, the flexible metal-cladded base material 1 preferably includes a carrier material on the opposite face of the metal foil 2 from the face on which the first resin layer 3 is present. This structure can prevent the metal foil 2 from having defects such as wrinkles which would otherwise occur in the formation of the first resin layer 3 on the metal foil 2 or further formation of the second resin layer 4. The carrier material may be another metal foil thicker than the metal foil 2, for example.

The second resin layer 4 is of a second resin composition containing an epoxy resin. In other words, for example, the second resin composition is applied onto the first resin layer 3, and the second resin composition on the first resin layer 3 is heated and dried to be semi-cured (into a B-stage), thus yielding a second resin layer 4.

Here, as described in the first mode, the first resin layer 3 of the present embodiment achieves high adhesion to a thermosetting resin composition such as an epoxy resin composition.

Hence, previous surface treatment for improving the adhesion of the first resin layer 3 is unnecessary when the second resin layer 4 is formed on the first resin layer 3. Thus, the productivity of the flexible metal-cladded base material 1 is increased.

The second resin composition particularly preferably contains an epoxy resin, a hardening agent, and a carbodiimide-modified soluble polyamide.

The epoxy resin in the second resin composition can include glycidyl ether epoxy resins, glycidyl ester epoxy resins, glycidylamine epoxy resins, and oxidized form epoxy resins. Examples of the glycidyl ether epoxy resin include bisphenol A epoxy resins, bisphenol F epoxy resins, novolac epoxy resins, and alcohol epoxy resins. Examples of the glycidyl ester epoxy resin include hydrophthalic acid epoxy resins and dimer acid epoxy resins. Examples of the glycidylamine epoxy resin include aromatic amine epoxy resins and aminophenol epoxy resins. Examples of the oxidized epoxy resin include alicyclic epoxy resins. Additional examples of the epoxy resin include epoxy resins having a naphthalene skeleton, novolac epoxy resins having a phenol skeleton and a biphenyl skeleton (biphenyl novolac epoxy resins), and phosphorus-modified epoxy resins (described later). The epoxy resin is preferably free from halogen.

In particular, the epoxy resin in the second resin composition preferably contains the epoxy resin having a naphthalene skeleton. This improves heat resistance, migration resistance, and chemical resistance of a printed wiring board. The epoxy resin having a naphthalene skeleton is preferably at least one compound of the compounds represented by Structural Formulae (11) to (13), and this further improves the heat resistance, the migration resistance, and the chemical resistance of a printed wiring board.

(n is an integer of 1 to 30)

[Chemical Formula 12]

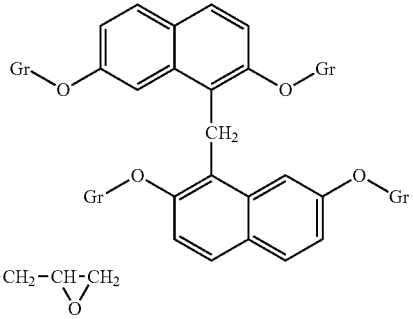

(13)

The hardening agent in the second resin composition can include polyamines, modified polyamines, acid anhydrides, hydrazine derivatives, polyphenols, and the like. Examples of the polyamine include aliphatic polyamines, alicyclic polyamines, and aromatic polyamines. Examples of the aliphatic polyamine specifically include diethylenetriamine, triethylenetetramine, tetraethylenepentamine, m-xylenediamine, trimethylhexamethylenediamine, 2-methylpentamethylenediamine, and diethylaminopropylamine. Examples of the alicyclic polyamine include isophoronediamine, 1,3-bisaminomethylcyclohexane, bis(4-aminocyclohexyl)methane, norbornenediamine, 1,2-diaminocyclohexane, and Laromin. Examples of the aromatic polyamine include diaminodiphenylmethane, m-phenylenediamine, and diaminodiphenylsulfone. Examples of the acid anhydride include hexahydrophthalic anhydride, methyltetrahydrophthalic anhydride, methyl-

[Chemical Formula 10]

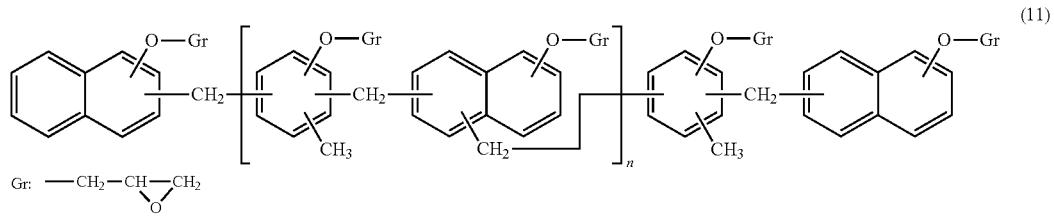

(11)

(n is an integer of 1 to 30)

[Chemical Formula 11]

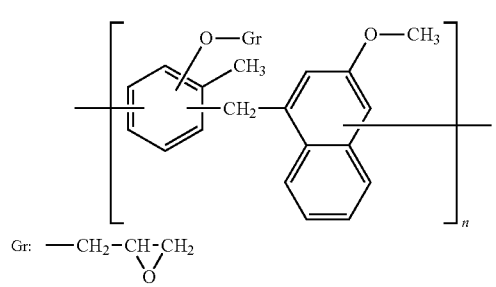

(12)

hexahydrophthalic anhydride, methylnadic anhydride, hydrogenated methylnadic anhydride, trialkyltetrahydrophthalic anhydride, methylcyclohexenetetracarboxylic dianhydride, trimellitic anhydride, pyromellitic anhydride, benzophenonetetracarboxylic dianhydride, and aliphatic dibasic polyanhydride. Examples of the polyphenol hardening agent include phenol novolac, xylene novolac, bis A novolac, triphenylmethane novolac, biphenyl novolac, dicyclopentadienephenol novolac, and terpenephenol novolac. The hardening agent may contain an aminotriazine novolac resin, a novolac phenol resin, or the like.

In particular, the hardening agent preferably contains at least one of an aminotriazine novolac resin represented by Structural Formula (14) and dicyandiamide. In this case, the second resin layer is kept stably in a B-stage state over a long period of time (improves the storage stability) and flame resistance and chemical resistance of a printed wiring board are improved.

[Chemical Formula 13]

(14)

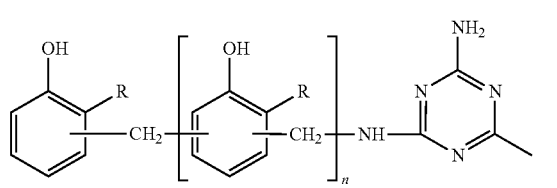

R is H or CH$_3$.
(n is an integer of 1 to 30)

The percentage of the hardening agent in the second resin composition to the total of the epoxy resin, the hardening agent, and the carbodiimide-modified soluble polyamide in the second resin composition is preferably in a range of 10 to 45% by mass.

The carbodiimide-modified soluble polyamide contained in the second resin composition is produced, for example, by reacting a soluble polyamide with a carbodiimide compound in the presence or absence of a solvent at a reaction temperature of, for example, 50 to 250° C.

The soluble polyamide is such a polyamide that 1 part by mass or more, preferably 5 parts by mass or more, or more preferably 10 parts by mass or more of the polyamide can be completely dissolved in 100 parts by mass of a mixture of an alcohol and at least one of an aromatic organic solvent and a ketone organic solvent. Examples of the alcohol include methanol, ethanol, and isopropyl alcohol. Examples of the aromatic organic solvent include benzene and toluene. Examples of the ketone organic solvent include cyclohexanone, 2-butanone, and cyclopentanone. These alcohols, aromatic solvents, and ketone solvents preferably have a boiling point of 130° C. or less.

The soluble polyamide is obtained by, for example, subjecting a polyamide (polyamide before solubilization) that is not soluble polyamides to a treatment for solubilization. The treatment method for solubilization is exemplified by a method of replacing some hydrogen atoms of the amido group of the polyamide before solubilization with a methoxymethyl group. The introduction of the methoxy group to the polyamide by the method eliminates the hydrogen-bonding capacity from the amido group, and therefore crystallization of the polyamide is suppressed and thus the solubility of the polyamide in a solvent is increased. Examples of the treatment method for solubilization also include a method of introducing polyether or polyester into the molecule of a polyamide before solubilization to yield a copolymer. Examples of the polyamide before solubilization include nylon 6, nylon 66, nylon 610, nylon 11, nylon 12, and nylon 46.

Specific examples of the soluble polyamide include Zytel 61 (trade name) available from DuPont, Versalon (trade name) available from General Mills, Inc., Amilan CM4000 (trade name) available from Toray Industries Inc., Amilan CM8000 (trade name) available from Toray Industries Inc., PA-100 (trade name) available from Fuji Kasei Co., Ltd., and Toresin (trade name) available from Nagase ChemteX Corporation.

The carbodiimide compound is defined as a compound having one or more carbodiimide groups in the molecule. Examples of the carbodiimide compound include monocarbodiimide compounds and polycarbodiimide compounds. The carbodiimide compound is synthesized, for example, by decarboxylative condensation of various polyisocyanates in the presence of an organophosphorus compound or an organometallic compound as a catalyst without solvent or in an inert solvent at a temperature of about 70° C. or higher.

Examples of the monocarbodiimide compound include dicyclohexylcarbodiimide, diisopropylcarbodiimide, dimethylcarbodiimide, diisobutylcarbodiimide, dioctylcarbodiimide, t-butylisopropylcarbodiimide, diphenylcarbodiimide, di-t-butylcarbodiimide, and di-β-naphthylcarbodiimide. Among them, dicyclohexylcarbodiimide or diisopropylcarbodiimide is preferred from the viewpoint of commercial availability.

The polycarbodiimide compound is produced by various methods. For example, a polycarbodiimide compound is produced by a known method for producing a polycarbodiimide (for example, see U.S. Pat. No. 2,941,956, description; J. Org. Chem. 28, 2069-2075 (1963); and Chemical Review 1981, Vol. 81, No. 4, pp 619-621).

The carbodiimide compound may be any compound having one or more carbodiimide groups in the molecule but is preferably a polycarbodiimide compound having two or more carbodiimide groups in the molecule, such as 4,4'-dicyclohexylmethanecarbodiimide from the viewpoint of improvement effects of reactivity and hydrolysis resistance and the like. Aliphatic or alicyclic polycarbodiimide compounds are particularly preferred. The polycarbodiimide compound preferably has a degree of polymerization ranging from 2 to 30 and more preferably from 2 to 20. A polycarbodiimide compound having a degree of polymerization of 2 or more is preferred in terms of further improving the heat resistance of a printed wiring board, and a polycarbodiimide compound having a degree of polymerization of 20 or less is preferred in terms of improving the compatibility among components in the second resin composition.

The polyisocyanate used to produce the polycarbodiimide compound is exemplified by an organic diisocyanate. Examples of the organic diisocyanate include aromatic diisocyanates, aliphatic diisocyanates, alicyclic diisocyanates, and mixtures of them. Specific examples include 1,5-naphthalene diisocyanate, 4,4'-diphenylmethane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, a mixture of 2,4-tolylene diisocyanate and 2,6-tolylene diisocyanate, hexamethylene diisocyanate, cyclohexane 1,4-diisocyanate, xylylene diisocyanate, isophorone diisocyanate, dicyclohexylmethane 4,4'-diisocyanate, methylcyclohexane diisocyanate, tetramethylxylylene diisocyanate, 2,6-diisopropylphenyl diisocyanate, and 1,3,5-triisopropylbenzene 2,4-diisocyanate. Among them, the aliphatic organic diisocyanates (including alicyclic organic diisocyanates) are preferred in terms of improving the flexibility and the moisture resistance of a printed wiring board, and specifically, isophorone diisocyanate, dicyclohexylmethane 4,4'-diisocyanate, tetramethylxylylene diisocyanate, and mixtures of them are more preferred.

During the production of the polycarbodiimide compound, for example, by cooling the reaction system of polymerization of a polyisocyanate, the polymerization is stopped midway of the reaction, and this can appropriately control the degree of polymerization of the polycarbodiimide compound. In this case, the terminal of the molecule of the polycarbodiimide compound is an isocyanate group. In order to more appropriately control the degree of polymerization of the polycarbodiimide compound, by reacting a compound (hereinafter called a terminal blocking agent) capable of reacting with an isocyanate group, such as a monoisocyanate compound, with all or some of the isocyanate groups at the terminal of the molecule of the polycarbodiimide compound, all or some of the isocyanate groups of the polycarbodiimide compound may be blocked. If the polycarbodiimide compound has an appropriately controlled degree of polymerization, the compatibility of a soluble polyamide with the polycarbodiimide compound is improved, and the storage stability of a member including the second resin layer is improved.

Examples of the monoisocyanate compound usable as the terminal blocking agent include phenyl isocyanate, tolyl isocyanate, dimethylphenyl isocyanate, cyclohexyl isocyanate, butyl isocyanate, and naphthyl isocyanate.

A terminal blocking agent except the monoisocyanate compound may be used. Examples of the terminal blocking agent except the monoisocyanate compound include active hydrogen compounds capable of reacting with an isocyanate group. Examples of the active hydrogen compound include (i) aliphatic, aromatic, and alicyclic compounds having an —OH group, such as methanol, ethanol, phenol, cyclohexanol, N-methylethanolamine, polyethylene glycol monomethyl ether, and polypropylene glycol monomethyl ether; (ii) compounds having a =NH group, such as diethylamine and dicyclohexylamine; (iii) compounds having a —NH$_2$ group, such as butylamine and cyclohexylamine; (iv) compounds having a —COOH group, such as succinic acid, benzoic acid, and cyclohexanoic acid; (v) compounds having a —SH group, such as ethyl mercaptan, allyl mercaptan, and thiophenol; (vi) compounds having an epoxy group; and (vii) acid anhydrides such as acetic anhydride, methyltetrahydrophthalic anhydride, and methylhexahydrophthalic anhydride.

The decarboxylative condensation of an organic diisocyanate can proceeds in the presence of an appropriate carbodiimidization catalyst. The carbodiimidization catalyst is preferably an organophosphorus compound and an organometallic compound (represented by general formula M-(OR)$_n$, where M is a metallic element such as titanium (Ti), sodium (Na), potassium (K), vanadium (V), tungsten (W), hafnium (Hf), zirconium (Zr), lead (Pb), manganese (Mn), nickel (Ni), calcium (Ca), and barium (Ba), R is an alkyl group having 1 to 20 carbon atoms or an aryl group, and n is the valence of M).

Among these carbodiimidization catalysts, in terms of specifically improving the reactivity, preferably used are phospholene oxides of the organophosphorus compound and alkoxides of titanium, hafnium, or zirconium of the organometallic compounds. Specific examples of the phospholene oxides include 3-methyl-1-phenyl-2-phospholene-1-oxide, 3-methyl-1-ethyl-2-phospholene-1-oxide, 1,3-dimethyl-2-phospholene-1-oxide, 1-phenyl-2-phospholene-1-oxide, 1-ethyl-2-phospholene-1-oxide, 1-methyl-2-phospholene-1-oxide, and geometric isomers of them. Among these phospholene oxides, 3-methyl-1-phenyl-2-phospholene-1-oxide is preferably used from the viewpoint of commercial availability.

The carbodiimide-modified soluble polyamide is produced by reacting a soluble polyamide with a carbodiimide compound in the presence or absence of a solvent. In this case, a reactive functional group such as a carboxyl group and an amino group of the soluble polyamide reacts with a group capable of reacting with the reactive functional group, such as a carbodiimide group and an isocyanate group of the carbodiimide compound.

Examples of the method of reacting the soluble polyamide with the carbodiimide compound in the presence of a solvent include a method of adding the soluble polyamide and the carbodiimide compound into a solvent and stirring the resulting solution under heat to promote the reaction. In particular, it is preferable that the soluble polyamide is first added to a solvent, the carbodiimide compound is further added to the resulting solution, and subsequently the solution is heated and stirred under reflux to promote the reaction. From the solution after the reaction, the solvent is removed under ambient pressure or under reduced pressure, and a carbodiimide-modified soluble polyamide is consequently obtained.

Examples of the method of reacting the soluble polyamide with the carbodiimide compound in the absence of a solvent include a method of heating the soluble polyamide at a temperature higher than the melting point and mixing the melted soluble polyamide with the carbodiimide compound to promote the reaction and a method of melting and kneading the soluble polyamide and the carbodiimide compound with a twin-screw extruder to promote the reaction.

For the reaction of the soluble polyamide with the carbodiimide compound, the amount of the carbodiimide compound relative to 100 parts by mass of the soluble polyamide is preferably in a range of 0.5 to 20 parts by mass and more preferably 1 to 10 parts by mass. In this case, a printed wiring board obtains sufficiently improved moisture resistance and heat resistance and a printed wiring board is unlikely to have excessively high flexibility or poor impact resistance. In other words, when the ratio of the carbodiimide compound is 0.5 parts by mass or more, a printed wiring board obtains sufficiently improved moisture resistance and heat resistance. When the ratio is 20 parts by mass or less, a printed wiring board is unlikely to have excessively high flexibility or poor impact resistance.

During the reaction of the soluble polyamide with the carbodiimide compound, a reaction system containing the polyamide and the carbodiimide compound is preferably free from any compound inhibiting the modification of the soluble polyamide, and the reaction system particularly preferably contains only a carbodiimide compound, a soluble polyamide, and a solvent used as needed. Specific examples of the compound inhibiting the modification of the soluble polyamide include epoxy resins, amine resins, melamine resins, and phenol resins.

The reaction time of the soluble polyamide with the carbodiimide compound is appropriately set depending on, for example, types of the soluble polyamide and the carbodiimide compound, a reaction method, and a reaction temperature but is preferably in a range of 1 to 500 minutes and more preferably in a range of 5 to 200 minutes.

The temperature of the reaction system for the reaction of the soluble polyamide with the carbodiimide compound is also appropriately set depending on, for example, types of the soluble polyamide and the carbodiimide compound, a reaction method, and a reaction temperature but is preferably in a range of 50 to 250° C. In particular, for a reaction of the soluble polyamide with the carbodiimide compound in the presence of a solvent, the reaction system preferably has a temperature ranging from 50 to 150° C. and more preferably ranging from 70 to 130° C. For a reaction of the soluble polyamide with the carbodiimide compound in the absence of a solvent, the reaction system preferably has a temperature ranging from 130 to 250° C. and more preferably ranging from 150 to 220° C. A reaction system having a temperature of 50° C. or higher sufficiently accelerates the reaction of the soluble polyamide with the carbodiimide compound to rapidly cause a modification of the soluble polyamide, and thus such a condition is industrially preferred. A reaction system having a temperature of 250° C. or lower is unlikely to deteriorate a product, for example, due to the degradation of a resin, and thus such a condition is preferred.

The reaction of the soluble polyamide with the carbodiimide compound in this manner modifies the soluble polyamide, thus yielding a carbodiimide-modified soluble polyamide. As the reaction proceeds, the amount of the carbodiimide group of the carbodiimide compound decreases. On this account, the infrared spectroscopic analysis of the raw material and the product indicates that peaks assigned to the carbodiimide group decrease in the infrared absorption spectrum of the product. Thermogravimetric analysis of the raw material and the product indicates that a plurality of absorption peaks such as an absorption peak arising from an amide resin and an absorption peak arising from a carbodiimide resin are observed in the spectrum of the raw material but a single peak is observed in the spectrum of the product. From these results, the modification of the soluble polyamide is ascertained.

A composition containing the carbodiimide-modified soluble polyamide has excellent storage stability as compared with a composition containing a soluble polyamide and a carbodiimide compound. In other words, a solution of the composition containing a soluble polyamide and a carbodiimide compound has higher viscosity and is likely to become a gel. In contrast, the composition containing the carbodiimide-modified soluble polyamide is unlikely to cause changes such as an increase in viscosity and thus can be stored for a long period of time.

The percentage of the carbodiimide-modified soluble polyamide in the second resin composition to the total of the epoxy resin, the hardening agent, and the carbodiimide-modified soluble polyamide in the second resin composition is preferably in a range of 20 to 70% by mass. When the percentage of the carbodiimide-modified soluble polyamide is 20% by mass or more, a printed wiring board obtains higher easy-bending properties. When the percentage is 70% by mass or less, a printed wiring board obtains higher flame resistance and heat resistance.

The second resin composition may contain a hardening accelerator such as 2-ethyl-4-methylimidazole, as necessary.

The second resin composition preferably, further contains a phenoxy resin. In this case the easy-bending properties of a printed wiring board is further improved. The phenoxy resin can include a bisphenol A phenoxy resin, a bisphenol A/bisphenol F copolymerization phenoxy resin, a phosphorus-modified phenoxy resin (described later), and the like. The percentage of the phenoxy resin in the second resin composition to the total of the second resin composition is preferably in a range of 5 to 30% by mass.

The second resin composition also preferably contains at least one phosphorus flame retardant of phosphorus-modified epoxy resins, phosphorus-modified phenoxy resins, and phosphazenes. In this case the flame resistance of a printed wiring board is more improved. The percentage of the total of the phosphorus-modified epoxy resin, the phosphorus-modified phenoxy resin, and the phosphorus flame retardant to the entire second resin composition is preferably in a range of 10 to 40% by mass.

The phosphorus-modified epoxy resin can be obtained, for example, by reacting 9,10-dihydro-9-oxa-10-phosphaphenanthrene-10-oxide with 1,4-naphthoquinone and further reacting the product with a cresol novolac resin.

The phosphorus-modified phenoxy resin is composed of a phenoxy resin as the main molecular framework and contains, for example, some (about 1 to 5) pieces of elemental phosphorus per mol of the phosphorus-modified phenoxy resin.

Examples of the phosphorus flame retardant include phosphazenes, monomer phosphoric acid esters, condensed phosphoric acid esters, reactive phosphorus flame retardants, phosphates, and phosphazene compounds. Specific examples of the monomer phosphoric acid ester include triphenyl phosphate, tricresyl phosphate, trixylyl phosphate, triethyl phosphate, cresyldiphenyl phosphate, xylyldiphenyl phosphate, cresyl bis(di-2,6-xylenyl) phosphate, and 2-ethylhexyldiphenyl phosphate. Specific examples of the condensed phosphoric acid ester include resorcinol bis(diphenyl) phosphate, bisphenol A bis(diphenyl) phosphate, bisphenol A bis(dicresyl) phosphate, and resorcinol bis(di-2,6-xylenyl) phosphate. Specific examples of the reactive phosphorus flame retardant include bisphenol A bisphenyl phosphate, 9,10-dihydro-9-oxa-10-phosphaphenanthrene-10-oxide, and 2-(diphenylphosphinyl)hydroquinone. Specific examples of the phosphate include melamine phosphate, dimelamine phosphate, melamine pyrophosphate, dimelamine pyrophosphate, melamine polyphosphate, and ethylenediamine phosphate. Specific examples of the phosphazene compound include phosphonitrilic acid phenyl ester, cyanophenol-phenol mixture-substituted cyclophosphazene, and a phosphonitrile chloride-hydroquinone-phenol condensate.

The second resin composition is preferably free from any filler. Commonly, a filler such as aluminum hydroxide and magnesium hydroxide may be used as a flame retardant, but it is preferable that such a filler is not used. In this case, even when a flexible printed wiring board is bent, fine cracks are unlikely to occur in the second electrically insulating layer 10, and therefore the flexible printed wiring board is prevented from having a poor appearance and high electrically insulating properties given by the second electrically insulating layer 10 is maintained.

The second resin composition is prepared by mixing the components. The second resin composition may further contain an organic solvent for controlling viscosity, as necessary.

The second resin composition obtained in this manner contains the carbodiimide-modified soluble polyamide, and thus the second resin composition obtains higher storage stability, adhesion, easy-bending properties, and packing properties. In other words, the carbodiimide-modified soluble polyamide is produced by reacting a reactive functional group such as a carboxyl group and an amino group of a soluble polyamide with a group capable of reacting with the reactive functional group, such as a carbodiimide group and an isocyanate group of a carbodiimide compound and thus is unlikely to react with an epoxy resin at a low temperature. Therefore the storage stability of the second resin composition is increased, and the storage stability and press formability of a flexible metal-cladded base material including the second resin layer of the second resin composition is also increased. In addition, the handling properties and processability (for example, storage stability and press formability) of the second resin composition and the second resin layer can be compatible with various characteristics (for example, adhesion, easy-bending properties, and packing property) of the printed wiring board.

The second resin composition containing the carbodiimide-modified soluble polyamide improves the electrical insulation properties of the second resin layer and further improves the flame resistance, the heat resistance, and the chemical resistance.

By using the second resin composition having the composition above, it is possible to form a second resin layer having high resin flow. The resin flow of the second resin layer can be easily controlled by adjusting the heating temperature or the heating speed when the second resin layer is formed by heating and drying a coating of the second resin composition.

The second resin layer 4 can be formed by applying the second resin composition on the first resin layer 3 and heating and drying the second resin composition to be semi-cured. In this case, the second resin layer composed of a semi-cured product of the second resin composition is formed. The method for applying the second resin composition may be an appropriate method such as comma coating, die coating, roll coating, and gravure coating. The heating conditions for heating and drying the second resin composition is appropriately set, but the heating temperature is preferably in a range of 130° C. to 160° C., and the heating time is preferably in a range of 2 to 10 minutes.

The thickness of the second resin layer 4 is not particularly limited but is preferably in a range of 10 to 40 μm in order to further improve the packing properties and to further thin a flexible printed wiring board.

The flexible metal-cladded base material 1 having high flexibility and formed in this manner is used to produce a printed wiring board and is particularly preferably used to produce a flexible printed wiring board. In other words, the metal foil 2 of the flexible metal-cladded base material 1 is utilized in order to form conductive wirings of a printed wiring board, and the first resin layer 3 and the second resin layer 4 of the flexible metal-cladded base material 1 are utilized in order to form an electrically insulating layer of a printed wiring board. For example, by fixing the flexible metal-cladded base material 1 on a core material, a multilayer printed wiring board can be produced.

The flexible metal-cladded base material 1 according to the present embodiment may include at least one particle-containing resin layer containing a silica having an average particle size of 5 to 200 nm and a maximum particle size of 500 nm or less in a range of 2 to 20 phr. The particle-containing resin layer is composed of a layer including, for example, a resin in a (fully) cured state (C stage state) or a semi-cured state (B-stage state) and the silica.

The average particle size of silica is determined by dynamic light scattering. The measuring device used is, for example, a particle size distribution analyzer (available from Otsuka Electronics Co., Ltd., model FPAR-1000). The maximum particle size of silica is determined by dynamic light scattering. Also in this case, the measuring device used is, for example, a particle size distribution analyzer (available from Otsuka Electronics Co., Ltd., model FPAR-1000). The silica is not particularly limited, but a spherical silica is preferably used. In this case the packing properties of silica in the particle-containing resin layer are improved. The spherical silica particles preferably have a spherical shape but do not necessarily have a spherical shape as long as the shape is regarded as substantially spherical shape.

By utilizing the particle-containing resin layer of the flexible metal-cladded base material 1 to form the electrically insulating layer of a printed wiring board, the electrically insulating layer obtains higher heat conductivity due to the action of the silica. In this case, it is avoided that a resin residue remains on the inner surface of a hole or unevenness occurs on the inner surface of a hole when the electrically insulating layer is irradiated with laser beams in order to form through-hole wirings. Additionally it is avoided that unevenness occurs on the inner surface of a hole even when the inner surface of a hole is subjected to desmear treatment with a desmear solution such as an alkaline permanganate solution. On this account, an even plated layer is readily formed when the inner surface of a hole formed by laser machining is subjected to plating treatment, and thus the through-hole wirings obtain higher conduction stability. In addition, a silica having such a particle size is unlikely to interfere with the flexibility of the electrically insulating layer. Hence it is possible to achieve both good laser processability and good easy-bending properties of a flexible printed wiring board or a flex-rigid printed wiring board.

The particle-containing resin layer may further contain an inorganic filler different from the silica having the particle sizes, as long as the effect is not impaired. However, the particle-containing resin layer is particularly preferably free from any inorganic filler except the silica having the particle sizes.

For example, in the first mode of the flexible metal-cladded base material 1 shown in FIG. 1, the first resin layer 3 may be the particle-containing resin layer. In other words, the first resin layer 3 may contain a silica having an average particle size of 5 to 200 nm and a maximum particle size of 500 nm or less in a range of 2 to 20 phr. For the first resin layer 3 that is the particle-containing resin layer, in the first mode, by adding a silica having an average particle size of 5 to 200 nm and a maximum particle size of 500 nm or less to the first resin composition in a range of 2 to 20 phr and by using the first resin composition, the first resin layer 3 can be formed. When the first resin layer 3 is the particle-containing resin layer in this manner, an electrically insulating layer formed of the first resin layer 3 obtains higher laser processability, and therefore it is particularly avoided that a resin residue remains on the inner surface of a hole. In addition, an electrically insulating layer formed of the first resin layer 3 can maintain good flexibility.

In the second mode of the flexible metal-cladded base material 1 shown in FIG. 2, at least one of the first resin layer 3 and the second resin layer 4 may be the particle-containing resin layer. In other words, at least one of the first resin layer 3 and the second resin layer 4 may contain a silica having an average particle size of 5 to 200 nm and a maximum particle size of 500 nm or less in a range of 2 to 20 phr. When the first resin layer 3 is the particle-containing resin layer, a resin residue is particularly unlikely to remain on the inner surface of a hole formed by laser machining of an electrically insulating layer, which is formed of the first resin layer 3 and the second resin layer 4. When the second resin layer 4 is the particle-containing resin layer, the inner surface of a hole that is formed by laser machining of an electrically insulating layer formed of the first resin layer 3 and the second resin layer 4 is particularly unlikely to be roughened, and thus an unevenness is unlikely to occur on the inner surface of the hole. On this account, the laser processability is improved when an electrically insulating layer is subjected to laser machining.

For the first resin layer 3 that is the particle-containing resin layer in the second mode, by adding a silica having an average particle size of 5 to 200 nm and a maximum particle size of 500 nm or less to the first resin composition in a range of 2 to 20 phr and by using the first resin composition, the first resin layer 3 can be formed.

For the second resin layer 3 that is the particle-containing resin layer in second mode, by adding a silica having an average particle size of 5 to 200 nm and a maximum particle size of 500 nm or less to the second resin composition in a range of 2 to 20 phr and by using the second resin composition, the second resin layer 3 can be formed.

In the second mode, each of the first resin layer 3 and the second resin layer 4 is particularly preferably the particle-containing resin layer. In other words, the first resin layer 3 preferably contains a silica having an average particle size of 5 to 200 nm and a maximum particle size of 500 nm or less in a range of 2 to 20 phr, and the second resin layer 4 preferably contains a silica having an average particle size of 5 to 200 nm and a maximum particle size of 500 nm or less in a range of 2 to 20 phr. In this case, it is particularly avoided that a resin residue is likely to remain on the inner surface of a hole and unevenness is likely to occur on the inner surface of the hole that is formed by laser machining of an electrically insulating layer formed of the first resin layer 3 and the second resin layer 4. On this account, the laser processability is markedly improved when an electrically insulating layer is subjected to laser machining.

A first mode of a printed wiring board produced by using the flexible metal-cladded base material 1 of the present embodiment will be described with reference to FIGS. 3(a) to 3(e).

Figure 3:
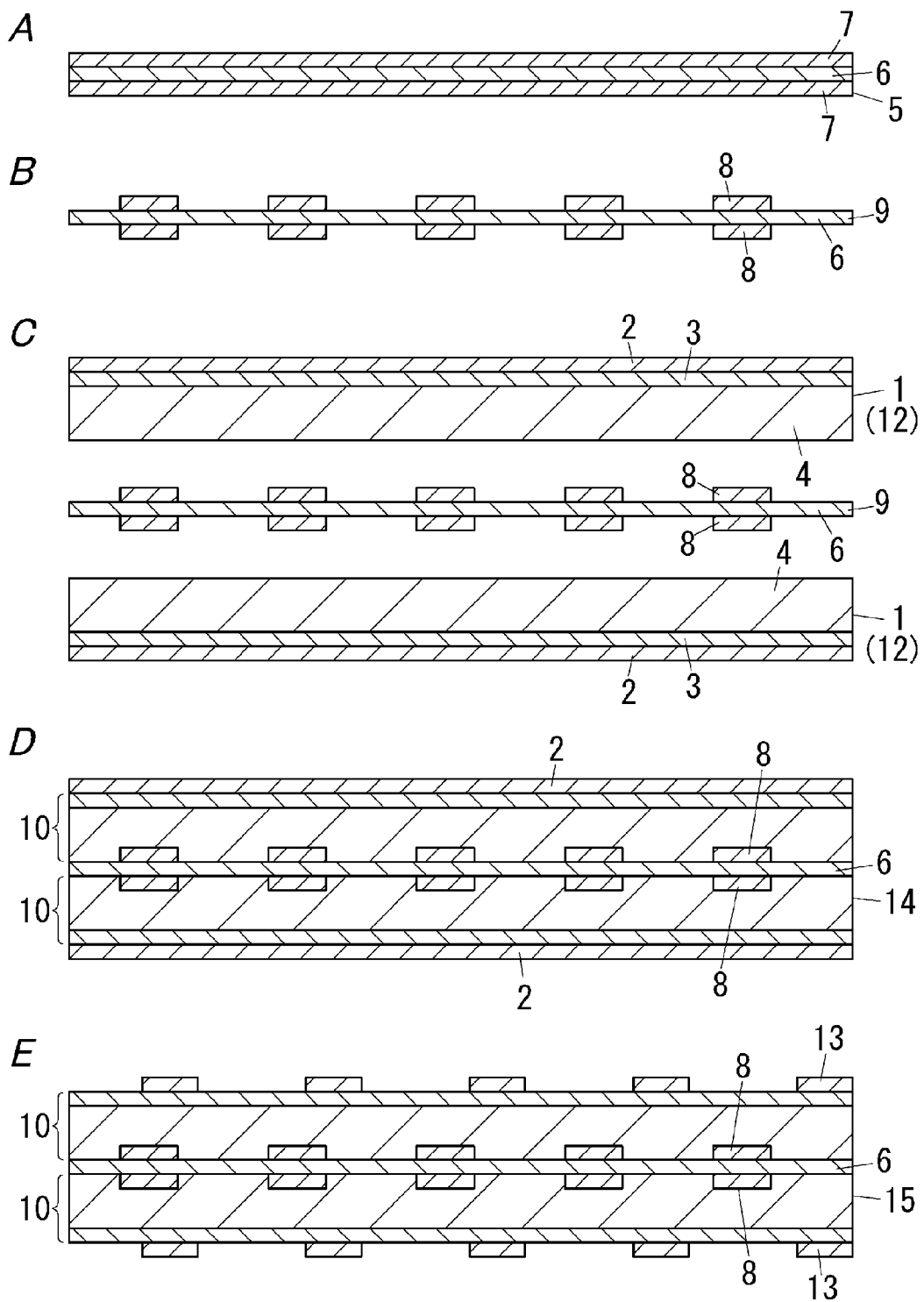
FIGS. 3(a) to 3(e) are cross-sectional views showing a production process of a multilayer flexible printed wiring board in the embodiment of the present invention.

First, as shown in FIG. 3(a), a flexible laminated plate 5 is prepared. The flexible laminated plate 5 includes a first electrically insulating layer 6 and two metal foils on opposite faces of the first electrically insulating layer 6. Note that, the flexible laminated plate 5 may include only one metal foil on one of the opposite faces of the first electrically insulating layer 6. The first electrically insulating layer 6 has easy-bending properties. The first electrically insulating layer 6 is made of various electrically insulating materials having high flexibility, such as polyimide resins, liquid crystal polymers, polyethylene terephthalate resins, and polyethylene naphthalate resins. The thickness of the first electrically insulating layer 6 is appropriately set but is preferably in a range of 12 to 50 μm. The material of the metal foil 7 is not particularly limited and is exemplified by copper foil. The flexible laminated plate 5 is formed, for example, by bonding or heat-sealing the metal foil 7 to the first electrically insulating layer 6.

As shown in FIG. 3(b), by subjecting the metal foil 7 of the flexible laminated plate 5 to etching treatment or other treatments, first conductive wirings 8 are formed. In addition, a hole may be formed in the first electrically insulating layer 6, and the inside of the hole may be plated to form a through-hole wiring. Thus, a core material 9 including the first electrically insulating layer 6 and the first conductive wirings 8 on the first electrically insulating layer 6 is prepared. The first conductive wirings 8 may be formed on one face in the thickness direction of the first electrically insulating layer 6 or may be formed on individual opposite faces in the thickness direction of the first electrically insulating layer 8.

As shown in FIG. 3(c) and FIG. 3(d), on the core material 9, the flexible metal-cladded base materials 1 (metal foils 12 with a flexible resin for multilayering) according to the second mode are situated. In this case, the flexible metal-cladded base materials 1 are situated on the respective faces of the core material 9 by use of the second resin layers 4 so as to cover the first conductive wirings 8. The flexible metal-cladded base material 1 may be situated on one face of the core material 9. Next, the flexible metal-cladded base materials 1 and the core material 9 are pressed together in the stacking direction and heated. The second resin layer 4 is thus softened to flow into gaps between lines of the first conductive wirings 8 and further flow into the insides of the through-hole wirings if the through-hole wirings are formed in the first electrically insulating layer 6. Next, the second resin layer 4 is thermally cured. Consequently, electrically insulating layers (second electrically insulating layers 10) including the first resin layers 3 and the cured product of the second resin layers 4 are formed.

As a result of integration of the core material 9 and the flexible metal-cladded base material 1 by stacking them with the technique above, a laminate 14 is obtained as shown in FIG. 3(d). The laminate 14 has the structure in which the first conductive wirings 8, the second electrically insulating layers 10, and the metal foils 2 are stacked in sequence on individual opposite faces in the thickness direction of the first electrically insulating layer 6. The laminate 14 may have the structure in which on a single face in the thickness direction of the first electrically insulating layer 6, the first conductive wirings 8, the second electrically insulating layer 10, and the metal foil 2 may be stacked in sequence.

In the laminate 14, by subjecting the metal foil 2 as the outermost layer derived from the flexible metal-cladded base material 1 to etching treatment or other treatments, conductive wirings (second conductive wirings 13) are formed as shown in FIG. 3(e). Consequently, a multilayer flexible printed wiring board 15 can be obtained. The multilayer flexible printed wiring board 15 has the structure in which the first conductive wirings 8, the second electrically insulating layers 10, and the second conductive wirings 13 are stacked in sequence on the individual opposite faces in the thickness direction of the first electrically insulating layer 6.

This example employs a single layer core material including a single electrically insulating layer is used, but may employ a multilayer core material including a plurality of electrically insulating layers instead of such a single layer core material. In addition, by sequentially stacking a plurality of the flexible metal-cladded base materials according to the present embodiment on the core material, a multilayer flexible printed wiring board can be processed into a further multilayered structure. In this manner, a multilayer flexible printed wiring board can be produced.

A second mode of the printed wiring board produced by using the flexible metal-cladded base material 1 of the present embodiment will be described with reference to FIGS. 4(a) to 4(c).

The printed wiring board is a flex-rigid printed wiring board 24 including two or more rigid parts 23 and one or more flexible parts 22 interconnecting the rigid parts 23. The rigid part 23 is a rigid portion having hardness and strength allowing the rigid portion to bear the weight of a member to be installed and to be fixed to a casing. The flexible part 22 is a flexible portion that is a portion of the core material 16 on which no layer is situated and that has such flexibility allowing the flexible portion to be bent. The flex-rigid printed wiring board is bent at the flexible part 22 and stored in a casing or the like, and thus is applicable to a compact and lightweight device such as a portable electronic device.

The flex-rigid printed wiring board is produced by using the flexible printed wiring board 15 according to the first mode shown in FIGS. 3(a) to 3(e) as a core material 16.

The core material 16 is processed into a multilayer structure except a part to be the flexible part 22, thus yielding the rigid parts 23. The technique for processing the material into a multilayer structure is not particularly limited and may be any known techniques. The present mode employs a build-up method by using a resin sheet 17 with a metal foil for multi-layering.

Figure 4:
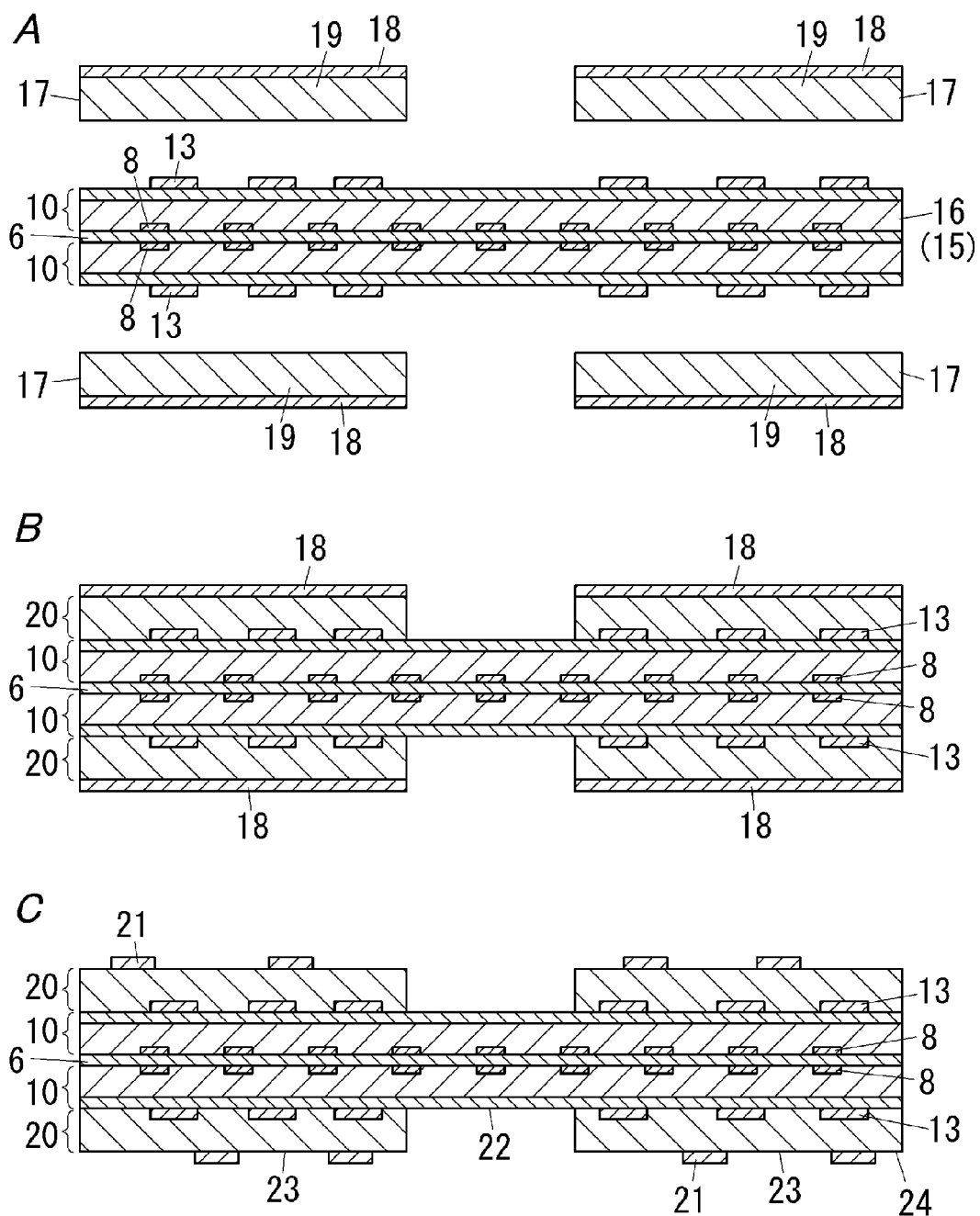
FIGS. 4(a) to 4(c) are cross-sectional views showing a production process of a flex-rigid printed wiring board in the embodiment of the present invention.

The resin sheet 17 with a metal foil includes, as shown in FIG. 4(a), a metal foil 18 and a resin layer 19 on one face of the metal foil 18. The resin sheet 17 with a metal foil is produced, for example, by applying a thermosetting resin composition such as an epoxy resin composition onto a mat face of the metal foil 18 such as a copper foil and heating and drying the thermosetting resin composition until the composition becomes a semi-cured state (B-stage state) to form a resin layer 19. The metal foil 18 preferably has a thickness ranging from 6 to 18 μm, and the resin layer 19 preferably has a thickness ranging from 10 to 100 μm.

As shown in FIG. 4(b), the resin layers 19 of the resin sheets 17 with metal foils are situated on individual opposite faces of a plurality of parts of the core material 16 reserved as the rigid parts 23, and the whole is heated and pressed to be molded. The resin layers 19 are thus bonded to the core material 16, and the resin layers 19 are cured to yield electrically insulating layers (third electrically insulating layers 20). The molding conditions are appropriately set and, for example, the molding pressure is set in a range of 1 to 3 MPa, and the molding temperature is set in a range of 160 to 200° C.

Next, as shown in FIG. 4(c), the metal foils 18 derived from the resin sheets 17 with a metal foil are subjected to etching treatment or other treatments to form conductive wirings (third conductive wirings 21). Consequently, the rigid parts 23 are formed, and the flexible part 22 is formed between adjacent rigid parts 23. In the rigid parts 23, through-holes, via holes, and the like may be formed as necessary. The rigid parts 23 may be processed by, for example, a build-up method into a further multilayered structure.

As shown in each mode, during the production of a printed wiring board by using a flexible metal-cladded base material 1, the flexible metal-cladded base material 1 according to the present embodiment is unlikely to warp and thus achieves good processing stability, and this improves the productivity of a printed wiring board. In addition, the flexible metal-cladded base material 1 is unlikely to warp as above, and this improves the dimensional accuracy of a printed wiring board produced by using the flexible metal-cladded base material 1.

EXAMPLES

Synthesis of Carbodiimide Compound

A mixture of 590 g of 4,4'-dicyclohexylmethane diisocyanate, 62.6 g of cyclohexyl isocyanate, and 6.12 g of a carbodiimidization catalyst (3-methyl-1-phenyl-2-phospholene-1-oxide) was prepared, and the mixture was heated at 180° C. for 48 hours to be reacted. Consequently, 4,4'-dicyclohexylmethanecarbodiimide resin (a degree of polymerization of 10) was synthesized.

Synthesis of Carbodiimide-Modified Soluble Polyamide

Into a separable flask having a volume of 1 l, 50.0 g of an ester copolymerization amide resin (available from Toray Industries Inc., trade name CM8000) and 450.0 g of a mixed solvent of isopropyl alcohol and toluene (a mixing mass ratio of 4:6) were added, and the mixture was stirred to be dissolved. To the solution obtained in the separable flask, 5.0 g of a carbodiimide compound (4,4'-dicyclohexylmethanecarbodiimide resin) was added. Next, the separable flask was immersed in an oil bath at 120° C., and the solution in the separable flask was heated and stirred for 3 hours under reflux. Subsequently, the solution was dried under reduced pressure to remove the solvent. This yielded a solution containing the carbodiimide-modified soluble polyamide.

The carbodiimide-modified soluble polyamide was subjected to infrared spectroscopic analysis, and the result showed an absorption peak indicating a carbodiimide group at 2,120 cm$^{-1}$. The carbodiimide-modified soluble polyamide was also subjected to differential scanning calorimetry, and the result showed an endothermic peak. The carbodiimide-modified soluble polyamide had a glass transition temperature (Tg) of 120° C. and a 5% weight reduction temperature of 320° C., and the solution had a viscosity of 860 mPa·s.

[Preparation of Second Resin Composition]

In a container, 27.2% by mass of an epoxy resin (an epoxy resin having a naphthalene skeleton, available from Nippon Kayaku Co., Ltd., product number NC-7000 L), 17.2% by mass of a hardening agent (an aminotriazine novolac resin, a methyl ethyl ketone solution having a resin solid content of 60% by mass, available from DIC Corporation, product number LA-7052), 36.4% by mass of the carbodiimide-modified soluble polyamide synthesized as above, 0.1% by mass of a hardening accelerator (available from Shikoku Chemicals Corporation, product number 2E4MZ), and 19.0% by mass of a phosphorus flame retardant (available from Otsuka Chemical Co., Ltd., product number SPB-100) were placed and mixed to yield a second resin composition having a solid content of 33% by mass.

Example 1

A mixture of 192 g of trimellitic anhydride (available from Nacalai Tesque, Inc.), 211 g of 4,4'-diisocyanato-3,3'-dimethylbiphenyl, 35 g of 2,4-diisocyanatotoluene, 1 g of diazabicycloundecene (available from San-Apro Ltd.), and 2,482 g of N,N-dimethylacetamide (DMAC, available from Nacalai Tesque, Inc.) was prepared to adjust a polymer concentration of 15% by mass, and the obtained mixture was heated to 100° C. over 1 hour and was maintained at 100° C. for 6 hours to be reacted.

Next, to the mixture, 1,460 g of DMAC was further added, and thus the polymer concentration was adjusted to 10% by mass. Subsequently, the mixture was cooled to room temperature. This yielded a resin solution (first resin composition) in which a polyamide imide was dissolved. The resin solution was a yellowish brown transparent liquid, which indicated that the polyamide imide was sufficiently dissolved.

With a comma coater and a dryer connected to the comma coater, the first resin composition was applied onto one face of a copper foil having a thickness of 12 µm. Subsequently, the first resin composition was heated at 200° C. for 4 minutes and then heated and dried at 250° C. for 10 minutes with the dryer. This yielded a first resin layer having a thickness of 7 µm on the copper foil. A single-sided flexible metal-cladded base material including the metal foil and the first resin layer on one face of the metal foil was consequently obtained.

Onto the first resin layer of the single-sided flexible metal-cladded base material, which had been subjected to no surface treatment, the second resin composition was applied with a comma coater and a dryer connected to the comma coater, and subsequently the second resin composition was heated and dried at 150° C. for 3 minutes. This yielded a second resin layer in a B-stage state having a thickness of 30 µm. Consequently, a metal foil with a flexible resin for multilayering including the metal foil, the first resin layer, and the second resin layer was obtained.

Examples 2 to 10, Comparative Example 1

The molar ratios of trimellitic anhydride, 4,4'-diisocyanato-3,3'-dimethylbiphenyl, and 2,4-diisocyanatotoluene for preparing the first resin composition in Example 1 were changed as shown in Table below.

In Examples 2 to 4 and 7 to 10, after the synthesis of the polyamide imide, in a resin solution in which the polyamide imide was dissolved, a bismaleimide was mixed in a ratio shown in Table. The ratio of the bismaleimide was the mass ratio of the bismaleimide relative to the total of the polyamide imide and the bismaleimide. In Table, "bismaleimide 1" is 4,4'-diphenylmethane bismaleimide (available from Daiwa Kasei Industrial Co., Ltd., product number BMI-1000), and "bismaleimide 2" is bisphenol A diphenyl ether bismaleimide (available from Daiwa Kasei Industrial Co., Ltd., product number BMI-4000).

In the same conditions as in Synthesis Example 1 except the above, single-sided flexible metal-cladded base materials and metal foils with a flexible resin for multilayering were obtained.

Comparative Example 21

First, 50 parts by mass of 3,3',4,4'-diphenylsulfone tetracarboxylic dianhydride was prepared, 40 parts by mass of 2,2-bis[4-(4-aminophenoxy)phenyl]propane and 10 parts by mass of 4,4'-diaminodiphenyl ether were prepared as diamine components, and 330 parts by mass of N-methyl-2-pyrrolidone was prepared as a solvent.

Next, the tetracarboxylic dianhydride was polycondensed with the diamine components to yield a polyamic acid, and then the polyamic acid was cyclized in the solvent to be imidized, thus yielding a polyimide varnish. The cyclization was promoted by heating the polyamic acid at 170° C., and thus the polyimide varnish having an imide ring-closing ratio of 98% was obtained.

With a comma coater and a dryer connected to the comma coater, the polyimide varnish was applied onto one face of a copper foil having a thickness of 12 μm, and subsequently the polyimide varnish was heated at 170° C. to be dried, thus yielding a polyimide resin layer having a thickness of 7 μm on the copper foil. Consequently, a single-sided flexible metal-cladded base material including the metal foil and the polyimide resin layer was obtained.

Onto the polyimide resin layer of the single-sided flexible metal-cladded base material, which had been subjected to no surface treatment, the second resin composition was applied with a comma coater and a dryer connected to the comma coater, and subsequently the second resin composition was heated and dried at 150° C. for 3 minutes. This yielded a second resin layer in a B-stage state having a thickness of 30 μm. Consequently, a metal foil with a flexible resin for multilayering including the metal foil, the polyimide resin layer, and the second resin layer was obtained.

Comparative Example 31

First, 50 parts by mass of 3,3',4,4'-diphenylsulfone tetracarboxylic dianhydride was prepared as a tetracarboxylic dianhydride, 40 parts by mass of 2,2-bis[4-(4-aminophenoxy)phenyl]propane and 10 parts by mass of 4,4'-diaminodiphenyl ether were prepared as diamine components, and 330 parts by mass of N-methyl-2-pyrrolidone was prepared as a solvent.

Next, the tetracarboxylic dianhydride was polycondensed with the diamine components to yield a polyamic acid, and then the polyamic acid was dissolved in the solvent, thus yielding a polyamic acid varnish. The cyclization was not promoted, and thus the polyamic acid varnish having an imide ring-closing ratio of 0% was obtained.

With a comma coater and a dryer connected to the comma coater, the polyamic acid varnish was applied onto one face of a copper foil having a thickness of 12 μm, and subsequently the polyamic acid varnish was heated at 300° C. to be dried and to undergo cyclization, thus yielding a polyimide resin layer (an imide ring-closing ratio of 98%) having a thickness of 7 μm on the copper foil. Consequently, a single-sided flexible metal-cladded base material including the metal foil and the polyimide resin layer was obtained.

Onto the polyimide resin layer of the single-sided flexible metal-cladded base material, which had been subjected to no surface treatment, the second resin composition was applied with a comma coater and a dryer connected to the comma coater, and subsequently the second resin composition was heated and dried at 150° C. for 3 minutes. This yielded a second resin layer in a B-stage state having a thickness of 30 μm. Consequently, a metal foil with a flexible resin for multilayering including the metal foil, the polyimide resin layer, and the second resin layer was obtained.

[Evaluation Test]
(Evaluation of Amount of Curvature)
From each single-sided flexible metal-cladded base material obtained in Examples and Comparative Examples, a sample having a length of 20 cm and a width of 20 cm in a planar view was cut out. Each sample was placed on a flat plate and observed, and a sample having a curvature expressed by an uplift amount form the surface of the flat plate of 10 mm or more was evaluated as failure, and a sample not having such a curvature was evaluated as acceptance.

(Solder Heat Resistance 1)
Each single-sided flexible metal-cladded base material obtained in Examples and Comparative Examples was immersed in a solder bath at 288° C. for 60 seconds. Subsequently the appearance of the single-sided flexible metal-cladded base material was observed. The temperature of the solder bath was changed to 300° C., and a similar test was carried out. A single-sided flexible metal-cladded base material without any appearance defects such as swelling and exfoliation was evaluated as acceptance, and that with appearance defects was evaluated as failure.

(Evaluation of Glass Transition Point and Elastic Modulus)
From each single-sided flexible metal-cladded base material obtained in Examples and Comparative Examples, the copper foil was removed by etching. Next, the glass transition point and the elastic modulus of the remaining resin layer were evaluated with a viscoelastic measuring apparatus.

(Adhesion Evaluation)
With regard to each of Examples and Comparative Examples, metal foils with a flexible resin for multilayering were situated on both faces of a polyimide film having a thickness of 25 μm, and the whole was heated and pressed at 180° C. for 1 hour to be molded, thus yielding a sample. The peel strength when the outermost copper foil of the sample was peeled in a 90°-direction was determined and was regarded as the index of adhesion between the first resin layer (or the polyimide resin layer) and the second resin layer.

(Solder Heat Resistance 2)
With regard to each of Examples and Comparative Examples, metal foils with a flexible resin for multilayering were situated on opposite faces of a polyimide film having a thickness of 25 μm, and the whole was heated and pressed at 180° C. for 1 hour to be molded, thus yielding a sample. The sample was immersed in a solder bath at 288° C. for 60 seconds, and subsequently the appearance of the sample was observed. A sample without any appearance defects such as swelling and exfoliation was evaluated as acceptance, and a sample with appearance defects was evaluated as failure.

(Folding Strength)
A single-sided flexible substrate including a polyimide film having a thickness of 25 μm and a copper foil having a thickness of 18 μm on one face of the polyimide film was prepared. The copper foil of the single-sided flexible substrate was subjected to patterning to form conductive wirings. With regard to each of Examples and Comparative Examples, metal foils with a flexible resin for multilayering were situated on opposite faces of the single-sided flexible substrate, and the whole was heated and pressed at 180° C. for 1 hour to be molded, thus yielding a laminate. The metal foils on the opposite faces of the laminate were removed by etching to yield a sample.

The sample was tested in accordance with MIT method. The measurement conditions were R=0.38 mm and a load of 500 g, and the number of folding times was 175 per minute. On the basis of the number of folding times until no conduction was observed through the conductive wirings, the folding strength was evaluated.

(Flame Resistance)

A both-sided flexible substrate including a polyimide film having a thickness of 25 µm and copper foils having a thickness of 9 µm on respective faces of the polyimide film was prepared. The copper foils on respective face of the both-sided flexible substrate were removed by etching. With regard to each of Examples and Comparative Examples, metal foils with a flexible resin for multilayering were situated on opposite faces of the remaining polyimide film, and the whole was heated and pressed at 180° C. for 1 hour to be molded, thus yielding a laminate. The metal foils on respective faces of the laminate were removed by etching to yield a sample. The flame resistance of the sample was evaluated by the evaluation standard of flame resistance in 94 VTM in accordance with UL94. A sample satisfying 94 VTM-0 was evaluated as acceptance, and a sample not satisfying 94 VTM-0 was evaluated as failure.

(Migration Resistance)

A single-sided flexible printed wiring board including an electrically insulating layer composed of a polyimide film and a comb-shaped electrode on one face of the electrically insulating layer was prepared. With regard to each of Examples and Comparative Examples, a metal foil with a flexible resin for multilayering was situated on the face with the comb-shaped electrode of the single-sided flexible printed wiring board, and the whole was heated and pressed at 180° C. for 1 hour to be molded, thus yielding a sample. While the sample was exposed to an environment at 85° C. and 85% RH, a voltage of 10 V was applied to the comb-shaped electrode for 250 hours. Next, the sample was visually observed, and thus the presence or absence of migration was evaluated. A sample in which no migration was observed was evaluated as acceptance, and a sample in which migration was observed was evaluated as failure.

TABLE 1

| | | Example | | | | | |
|---|---|---|---|---|---|---|---|
| | | 1 | 2 | 3 | 4 | 5 | 6 |
| Trimellitic anhydride | % by mol | 50 | 50 | 50 | 50 | 50 | 50 |
| 4,4'-Diisocyanato-3,3'-dimethylbiphenyl | % by mol | 40 | 40 | 40 | 40 | 47 | 33 |
| Diisocyanatotoluene | % by mol | 10 | 10 | 10 | 10 | 3 | 17 |
| Bismaleimide 1 | % by mass | 0 | 10 | 0 | 0 | 0 | 0 |
| Bismaleimide 2 | % by mass | 0 | 0 | 10 | 15 | 0 | 0 |
| 3,3',4,4'-Diphenylsulfone tetracarboxylic dianhydride | Parts by mass | — | — | — | — | — | — |
| 2,2-Bis[4-(4-aminophenoxy)phenyl]propane | Parts by mass | — | — | — | — | — | — |
| 4,4'-Diaminodiphenyl ether | Parts by mass | — | — | — | — | — | — |
| Amount of curvature | | Acceptance | Acceptance | Acceptance | Acceptance | Acceptance | Acceptance |
| Solder heat resistance 1 (288° C.) | | Acceptance | Acceptance | Acceptance | Acceptance | Acceptance | Acceptance |
| Solder heat resistance 1 (300° C.) | | Failure | Acceptance | Acceptance | Acceptance | Acceptance | Failure |
| Glass transition point | ° C. | 325 | 336 | 330 | 334 | 330 | 325 |
| Elastic modulus | GPa | 2.3 | 2.6 | 2.6 | 1.8 | 1.9 | 1.7 |
| Adhesion | kN/m | 0.9 | 0.9 | 0.9 | 0.9 | 0.9 | 0.9 |
| Solder heat resistance 2 (288° C.) | — | Acceptance | Acceptance | Acceptance | Acceptance | Acceptance | Acceptance |
| Folding strength | Number of times | 150 | 240 | 180 | 195 | 150 | 160 |
| Flame resistance | — | Acceptance | Acceptance | Acceptance | Acceptance | Acceptance | Acceptance |
| Migration resistance | — | Acceptance | Acceptance | Acceptance | Acceptance | Acceptance | Acceptance |

TABLE 2

| | | Example | | | | Comparative Example | | |
|---|---|---|---|---|---|---|---|---|
| | | 7 | 8 | 9 | 10 | 1 | 2 | 3 |
| Trimellitic anhydride | % by mol | 50 | 50 | 50 | 50 | 50 | — | — |
| 4,4'-Diisocyanato-3,3'-dimethylbiphenyl | % by mol | 47 | 33 | 47 | 33 | 0 | — | — |
| Diisocyanatotoluene | % by mol | 3 | 17 | 3 | 17 | 50 | — | — |
| Bismaleimide 1 | % by mass | 3 | 3 | 30 | 30 | 0 | — | — |
| Bismaleimide 2 | % by mass | 0 | 0 | 0 | 0 | 0 | — | — |
| 3,3',4,4'-Diphenylsulfone tetracarboxylic dianhydride | Parts by mass | — | — | — | — | — | 50 | 50 |
| 2,2-Bis[4-(4-aminophenoxy)phenyl]propane | Parts by mass | — | — | — | — | — | 40 | 40 |
| 4,4'-Diaminodiphenyl ether | Parts by mass | — | — | — | — | — | 10 | 10 |
| Amount of curvature | | Acceptance | Acceptance | Acceptance | Acceptance | Failure | Acceptance | Failure |

TABLE 2-continued

|  |  | Example | | | | Comparative Example | | |
| --- | --- | --- | --- | --- | --- | --- | --- | --- |
|  |  | 7 | 8 | 9 | 10 | 1 | 2 | 3 |
| Solder heat resistance 1 (288° C.) |  | Acceptance | Acceptance | Acceptance | Acceptance | Acceptance | Acceptance | Acceptance |
| Solder heat resistance 1 (300° C.) |  | Acceptance | Acceptance | Acceptance | Acceptance | Failure | Acceptance | Acceptance |
| Glass transition point | ° C. | 335 | 328 | 340 | 333 | — | 305 | 305 |
| Elastic modulus | GPa | 1.8 | 1.6 | 1.8 | 1.7 | — | 1.6 | 1.6 |
| Adhesion | kN/m | 0.9 | 0.9 | 0.9 | 0.9 | 0.9 | 0.3 | 0.3 |
| Solder heat resistance 2 (288° C.) | — | Acceptance | Acceptance | Acceptance | Acceptance | Acceptance | Acceptance | Acceptance |
| Folding strength | Number of times | 140 | 170 | 140 | 150 | 150 | 180 | 170 |
| Flame resistance | — | Acceptance | Acceptance | Acceptance | Acceptance | Acceptance | Acceptance | Acceptance |
| Migration resistance | — | Acceptance | Acceptance | Acceptance | Acceptance | Acceptance | Acceptance | Acceptance |

Examples 11 to 241

Preparation of First Resin

Trimellitic anhydride (available from Nacalai Tesque, Inc.) and 4,4'-oxybis(isocyanatobenzene) were mixed in a molar ratio of 50:50. To 438 parts by mass of the mixture, 1 part by mass of diazabicycloundecene (available from San-Apro Ltd.) and 2,482 parts by mass of N,N-dimethylacetamide (DMAC, available from Nacalai Tesque, Inc.) were added to yield a mixture having a polymer concentration of 15% by mass. The mixture was heated to 100° C. over 1 hour and was maintained at 100° C. for 6 hours to be reacted.

Next, to the mixture, 1,460 parts by mass of DMAC was further added, and thus the polymer concentration was adjusted to 10% by mass. Subsequently, the mixture was cooled to room temperature. This yielded a resin solution in which the first resin was dissolved.

Preparation of Second Resin

Trimellitic anhydride (available from Nacalai Tesque, Inc.), 4,4'-diisocyanato-3,3'-dimethylbiphenyl, and 2,4-diisocyanatotoluene were mixed in a molar ratio shown in Table below. To 438 parts by mass of the mixture, 1 part by mass of diazabicycloundecene (available from San-Apro Ltd.) and 2,482 parts by mass of N,N-dimethylacetamide (DMAC, available from Nacalai Tesque, Inc.) were added to yield a mixture having a polymer concentration of 15% by mass. The mixture was heated to 100° C. over 1 hour and was maintained at 100° C. for 6 hours to be reacted.

Next, to the mixture, 1,460 parts by mass of DMAC was further added, and thus the polymer concentration was adjusted to 10% by mass. Subsequently, the mixture was cooled to room temperature. This yielded a resin solution in which the second resin was dissolved.

Preparation of Second Resin Composition

In a container, 27.2% by mass of an epoxy resin (an epoxy resin having a naphthalene skeleton, available from Nippon Kayaku Co., Ltd., product number NC-7000 L), 17.2% by mass of a hardening agent (an aminotriazine novolac resin, a methyl ethyl ketone solution having a resin solid content of 60% by mass, available from DIC Corporation, product number LA-7052), 36.4% by mass of the carbodiimide-modified soluble polyamide synthesized as above, 0.1% by mass of a hardening accelerator (available from Shikoku Chemicals Corporation, product number 2E4MZ), and 19.0% by mass of a phosphorus flame retardant (available from Otsuka Chemical Co., Ltd., product number SPB-100) were placed and mixed to yield a second resin composition having a solid content of 33% by mass.

Production of Single-Sided Flexible Metal-Cladded Base Material

As raw materials, a resin solution in which the first resin was dissolved, a resin solution in which the second resin was dissolved, bismaleimide 1 (4,4'-diphenylmethane bismaleimide, available from Daiwa Kasei Industrial Co., Ltd., product number BMI-1000), and bismaleimide 2 (bisphenol A diphenyl ether bismaleimide, available from Daiwa Kasei Industrial Co., Ltd., product number BMI-4000) were prepared.

In each of Examples and Comparative Examples, the raw materials were mixed so as to give the ratio shown in Table, and thus a first resin composition was prepared.

Separately, a copper foil having a thickness of 12 μm was prepared as a metal foil. Onto one face of the copper foil, the first resin composition was applied with a comma coater and a dryer connected to the comma coater. Subsequently, the first resin composition was heated at 200° C. for 4 minutes and then heated and dried at 250° C. for 10 minutes with the dryer. This yielded a first resin layer having the thickness shown in Table on the copper foil.

Consequently, a single-sided flexible metal-cladded base material including the metal foil and the first resin layer on one face of the metal foil was obtained.

Production of Metal Foil with Flexible Resin for Multilayering

Onto the first resin layer of the single-sided flexible metal-cladded base material, which had been subjected to no surface treatment, the second resin composition was applied with a comma coater and a dryer connected to the comma coater. Subsequently, the second resin composition was heated and dried at 150° C. for 3 minutes. This yielded a second resin layer in a B-stage state having a thickness of 30 μm.

Consequently, a metal foil with a flexible resin for multilayering including the metal foil, the first resin layer, and the second resin layer was obtained.

[Evaluation Test]

Examples 11 to 24 were subjected to the evaluation tests below.

(Evaluation of Amount of Curvature)

The evaluation was carried out in the same manner as in Example 1 and others.

(Solder Heat Resistance 1)

A single-sided flexible metal-cladded base material was immersed in a solder bath at 288° C. for 60 seconds, and subsequently the appearance of the single-sided flexible metal-cladded base material was observed. A single-sided flexible metal-cladded base material without any appearance defects such as swelling and exfoliation was evaluated as "acceptance", and that with appearance defects was evaluated as "failure".

(Evaluation of Glass Transition Point and Elastic Modulus)

The evaluation was carried out in the same manner as in Example 1 and others.

(Adhesion Evaluation)

The evaluation was carried out in the same manner as in Example 1 and others.

(Solder Heat Resistance 2)

A metal foil with a flexible resin for multilayering was superimposed on each face of a polyimide film having a thickness of 25 μm, and the whole was heated and pressurized at 180° C. for 1 hour to be molded, thus yielding a sample.

While the sample was immersed in a solder bath at 288° C., a changed in appearance of the sample was observed with time. The temperature of the solder bath was changed to 300° C., and a similar test was carried out.

A sample of which the elapsed time from the start of immersion to the occurrence of an appearance defect such as swelling and exfoliation was less than 1 minute was evaluated as "C", and a sample of which the elapsed time was not less than 1 minute and less than 4 minutes was evaluated as "B". A sample in which no appearance defect was observed after 4 minutes of the immersion was evaluated as "A".

(Folding Strength)

The evaluation was carried out in the same manner as in Example 1 and others.

(Flame Resistance)

The evaluation was carried out in the same manner as in Example 1 and others.

(Migration Resistance)

The evaluation was carried out in the same manner as in Example 1 and others.

TABLE 3

| | | Example | | | | | | |
|---|---|---|---|---|---|---|---|---|
| | | 11 | 12 | 13 | 14 | 15 | 16 | 17 |
| Raw material composition (% by mol) of second resin | Trimellitic anhydride | 50 | 50 | 50 | 50 | 50 | 50 | 50 |
| | 4,4'-Diisocyanato-3,3'-dimethylbiphenyl | 40 | 40 | 40 | 40 | 40 | 40 | 47 |
| | Diisocyanatotoluene | 10 | 10 | 10 | 10 | 10 | 10 | 3 |
| Solid content composition (parts by mass) of first resin composition | First resin | 70 | 50 | 30 | 63 | 45 | 27 | 50 |
| | Second resin | 30 | 50 | 70 | 27 | 45 | 63 | 50 |
| | Bismaleimide 1 | 0 | 0 | 0 | 10 | 10 | 10 | 0 |
| | Bismaleimide 2 | 0 | 0 | 0 | 0 | 0 | 0 | 0 |
| Thickness (μm) of first resin layer | | 4 | 4 | 4 | 4 | 4 | 4 | 4 |
| Evaluation of single-sided flexible metal-cladded base material | Amount of curvature | Acceptance | Acceptance | Acceptance | Acceptance | Acceptance | Acceptance | Acceptance |
| | Solder heat resistance 1 | Acceptance | Acceptance | Acceptance | Acceptance | Acceptance | Acceptance | Acceptance |
| | Glass transition point (° C.) | 305 | 311 | 315 | 295 | 305 | 310 | 316 |
| | Elastic modulus (GPa) | 1.5 | 2.0 | 2.5 | 1.4 | 1.9 | 2.4 | 1.8 |
| Evaluation of metal foil with flexible resin for multilayering | Adhesion (kN/m) | 0.9 | 0.9 | 0.9 | 0.9 | 0.9 | 0.9 | 0.9 |
| | Solder heat resistance 2 (288° C.) | A | A | A | A | A | A | A |
| | Solder heat resistance 2 (300° C.) | B | B | B | A | A | A | B |
| | Folding strength (Number of times) | 465 | 420 | 360 | 442 | 400 | 345 | 420 |
| | Flame resistance | Acceptance | Acceptance | Acceptance | Acceptance | Acceptance | Acceptance | Acceptance |
| | Migration resistance | Acceptance | Acceptance | Acceptance | Acceptance | Acceptance | Acceptance | Acceptance |

TABLE 4

| | | Example | | | | | | |
|---|---|---|---|---|---|---|---|---|
| | | 18 | 19 | 20 | 21 | 22 | 23 | 24 |
| Raw material composition (% by mol) of second resin | Trimellitic anhydride | 50 | 50 | 50 | 50 | 50 | 50 | 50 |
| | 4,4'-Diisocyanato-3,3'-dimethylbiphenyl | 33 | 40 | 40 | 40 | 40 | 40 | 40 |
| | Diisocyanatotoluene | 17 | 10 | 10 | 10 | 10 | 10 | 10 |
| Solid content composition (parts by mass) of first resin composition | First resin | 50 | 45 | 45 | 45 | 45 | 0 | 0 |
| | Second resin | 50 | 45 | 45 | 45 | 45 | 90 | 100 |
| | Bismaleimide 1 | 0 | 0 | 10 | 10 | 10 | 10 | 0 |
| | Bismaleimide 2 | 0 | 10 | 0 | 0 | 0 | 0 | 0 |
| Thickness (μm) of first resin layer | | 4 | 4 | 2 | 8 | 10 | 4 | 4 |
| Evaluation of single-sided flexible metal-cladded base material | Amount of curvature | Acceptance | Acceptance | Acceptance | Acceptance | Acceptance | Acceptance | Acceptance |
| | Solder heat resistance 1 | Acceptance | Acceptance | Acceptance | Acceptance | Acceptance | Acceptance | Acceptance |
| | Glass transition point (° C.) | 310 | 305 | 305 | 305 | 305 | 320 | 330 |
| | Elastic modulus (GPa) | 1.7 | 1.9 | 1.9 | 1.9 | 1.9 | 3.2 | 3.3 |

TABLE 4-continued

| | | Example | | | | | | |
|---|---|---|---|---|---|---|---|---|
| | | 18 | 19 | 20 | 21 | 22 | 23 | 24 |
| Evaluation of metal foil with flexible resin for multilayering | Adhesion (kN/m) | 0.9 | 0.9 | 0.9 | 0.9 | 0.9 | 0.9 | 0.9 |
| | Solder heat resistance 2 (288° C.) | A | A | A | A | A | A | A |
| | Solder heat resistance 2 (300° C.) | B | A | A | A | B | A | B |
| | Folding strength (Number of times) | 430 | 400 | 430 | 390 | 370 | 250 | 270 |
| | Flame resistance | Acceptance | Acceptance | Acceptance | Acceptance | Acceptance | Acceptance | Acceptance |
| | Migration resistance | Acceptance | Acceptance | Acceptance | Acceptance | Acceptance | Acceptance | Acceptance |

REFERENCE SIGNS LIST

1 Flexible metal-cladded base material
2 Metal foil
3 First resin layer
4 Second resin layer
15 Printed wiring board

The invention claimed is:

1. A flexible metal-cladded base material comprising:
a metal foil; and
a first resin layer on the metal foil,
the first resin layer being of a first resin composition containing a polyamide-imide resin,
the polyamide-imide resin including a first constituent unit represented by Structural Formula (1) and a second constituent unit represented by Structural Formula (2):

[Chemical Formula 1]

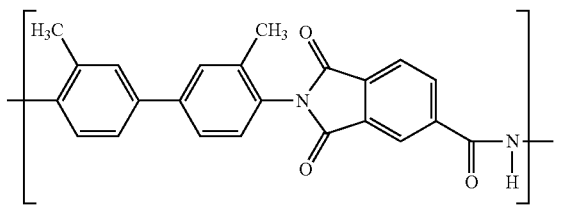

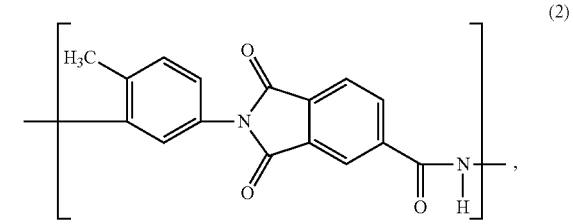

and
a percentage of the second constituent unit to a total of the first constituent unit and the second constituent unit in the polyamide-imide resin being in a range of 5 to 35% by mol.

2. The flexible metal-cladded base material according to claim 1, wherein
the polyamide-imide resin further includes a third constituent unit represented by Structural Formula (3):

[Chemical Formula 2]

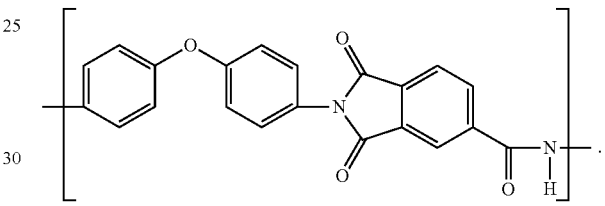

3. The flexible metal-cladded base material according to claim 2, wherein
the polyamide-imide resin includes a first resin consisting of a molecule including the third constituent unit and a second resin consisting of a molecule including the first constituent unit and the second constituent unit.

4. The flexible metal-cladded base material according to claim 3, wherein
a percentage of the second resin to the polyamide-imide resin is in a range of 30 to 70% by mass.

5. The flexible metal-cladded base material according to claim 1, wherein
the first resin composition further contains a bismaleimide.

6. The flexible metal-cladded base material according to claim 5, wherein
the bismaleimide is at least one compound selected from 4,4'-diphenylmethane bismaleimide, bisphenol A diphenyl ether bismaleimide, 3,3'-dimethyl-5,5'-diethyl-4,4'-diphenylmethane bismaleimide, and 1,6'-bismaleimide-(2,2,4-trimethyl)hexane.

7. The flexible metal-cladded base material according to claim 5, wherein
a percentage of the bismaleimide to a total of the polyamide-imide resin and the bismaleimide in the first resin composition is in a range of 3 to 30% by mass.

8. The flexible metal-cladded base material according to claim 1, wherein
the first resin layer has a thickness ranging from 1 to 15 μm.

9. The flexible metal-cladded base material according to claim 1, further comprising a second resin layer in a B-stage state on the first resin layer,
the second resin layer being of a second resin composition containing an epoxy resin.

10. The flexible metal-cladded base material according to claim 9, wherein
the second resin composition further contains a hardening agent and a carbodiimide-modified soluble polyamide.

11. The flexible metal-cladded base material according to claim 9, wherein
the second resin layer has a thickness ranging from 10 to 40 μm.

12. A printed wiring board comprising:
an electrically insulating layer made of the first resin layer and the second resin layer of the flexible metal-cladded base material according to claim 9; and
a conductive wiring made of the metal foil of the flexible metal-cladded base material.

13. A multilayer flexible printed wiring board comprising:
an electrically insulating layer made of the first resin layer and the second resin layer of the flexible metal-cladded base material according to claim 9; and
a conductive wiring made of the metal foil of the flexible metal-cladded base material.

14. A flex-rigid printed wiring board including two or more rigid parts and one or more flexible part interconnecting adjacent rigid parts of the two or more rigid parts, the flex-rigid printed wiring board comprising:
an electrically insulating layer made of the first resin layer and the second resin layer of the flexible metal-cladded base material according to claim 9; and
a conductive wiring made of the metal foil of the flexible metal-cladded base material.

15. A production method of a flexible metal-cladded base material, the method comprising applying a first resin composition onto a metal foil; and heating the first resin composition at a temperature to form a first resin layer,
the first resin composition containing a polyamide-imide resin,
the polyamide-imide resin including a first constituent unit represented by Structural Formula (1) and a second constituent unit represented by Structural Formula (2),

[Chemical Formula 3]

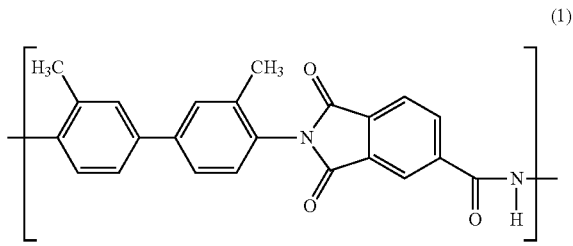

(1)

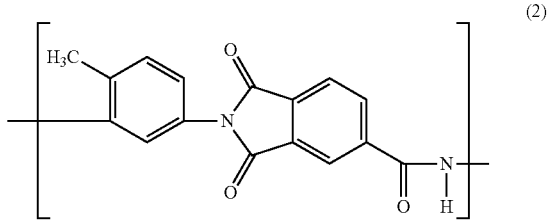

(2)

a percentage of the second constituent unit to a total of the first constituent unit and the second constituent unit in the polyamide-imide resin being in a range of 5 to 35% by mol, and
a maximum of the temperature being in a range of 230 to 290° C.

16. The production method of a flexible metal-cladded base material according to claim 15, wherein
the first resin composition further contains a bismaleimide.

17. The production method of a flexible metal-cladded base material according to claim 15, the method further comprising applying a second resin composition containing an epoxy resin onto the first resin layer; and heating the second resin composition to form a second resin layer in a B-stage state.

* * * * *